(12) United States Patent
Jang et al.

(10) Patent No.: US 8,035,152 B2
(45) Date of Patent: Oct. 11, 2011

(54) SEMICONDUCTOR DEVICE HAVING SHARED BIT LINE STRUCTURE

(75) Inventors: Dong-hoon Jang, Seoul (KR);
Young-bae Yoon, Yong-in Shi (KR);
Hee-soo Kang, Yong-in Shi (KR);
Young-seop Rah, Yong-in Shi (KR);
Jeong-dong Choe, An-yang Shi (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 186 days.

(21) Appl. No.: 12/457,813

(22) Filed: Jun. 22, 2009

(65) Prior Publication Data

US 2010/0001366 A1    Jan. 7, 2010

(30) Foreign Application Priority Data

Jun. 24, 2008   (KR) ........................ 10-2008-0059781

(51) Int. Cl.
*H01L 29/788* (2006.01)
(52) U.S. Cl. ................................ 257/315; 257/E21.658
(58) Field of Classification Search .................. 257/315, 257/E21.658
See application file for complete search history.

(56) References Cited

U.S. PATENT DOCUMENTS

| | | | |
|---|---|---|---|
| 6,151,249 A | 11/2000 | Shirota et al. | |
| 2005/0227426 A1* | 10/2005 | Deppe et al. | .................. 438/201 |
| 2007/0026655 A1 | 2/2007 | Kim et al. | |
| 2007/0290248 A1* | 12/2007 | Weis | .............................. 257/301 |
| 2009/0200533 A1* | 8/2009 | Ufert et al. | .......................... 257/2 |

FOREIGN PATENT DOCUMENTS

KR   10-2005-0045179 A   5/2005

* cited by examiner

*Primary Examiner* — Jerome Jackson, Jr.
*Assistant Examiner* — Paul Budd
(74) *Attorney, Agent, or Firm* — Lee & Morse, P.C.

(57) ABSTRACT

A semiconductor device, including a substrate having first and second active regions, the first and second active regions being disposed on opposite sides of an isolation structure, and a bit line electrically coupled to a contact plug that is on the isolation structure between the first active region and the second active region, and electrically coupled to an active bridge pattern directly contacting at least one of the first and second active regions, wherein the contact plug is electrically coupled to the first active region and the second active region, and a bottom surface of the active bridge pattern is below a top surface of the first and second active regions.

14 Claims, 23 Drawing Sheets

SEMICONDUCTOR DEVICE HAVING SHARED BIT LINE STRUCTURE

BACKGROUND

1. Field

Example embodiments relate to a semiconductor device having shared bitline structure and method of manufacturing the same.

2. Description of the Related Art

Advances in semiconductor device design have let to highly integrated devices. The high degree of integration results in features, e.g., conductive lines such as bit lines, that are closely spaced together, which may result in unwanted interactions between adjacent features. For example, closely-spaced bit lines may generate RC delays due to interaction therebetween. Accordingly, there is a need for a device design that reduces or eliminates such unwanted interactions while maintaining a high level of integration. Further, there is a need for a method of manufacturing a highly integrated device that reduces a number of process steps, particularly photolithographic operations.

SUMMARY

Example embodiments are therefore directed to providing a semiconductor device having shared bitline structure and method of manufacturing the same, which substantially overcome one or more of the problems associated with the related art.

It is therefore a feature of an embodiment to provide a semiconductor device having a bit line contact disposed on an isolation region.

It is therefore another feature of an embodiment to provide a semiconductor device having a shared bit line contact plug that electrically couples two adjacent active regions to a single bit line.

It is another feature of an embodiment to provide a method of fabricating a device according to embodiments in which photolithographic operations are reduced.

At least one of the above and other features and advantages may be realized by providing a semiconductor device, including a substrate having first and second active regions, the first and second active regions being disposed on opposite sides of an isolation structure, and a bit line electrically coupled to a contact plug that is on the isolation structure between the first active region and the second active region, and an active bridge pattern directly contacting at least one of the first and second active regions, wherein the contact plug is electrically coupled to the first active region and the second active region, and a bottom surface of the active bridge pattern is below a top surface of the first and second active regions.

The contact plug may be directly over at least one of the first active region and the second active region.

The device may further include a recess between an upper surface of the first active region and an upper surface of the second active region, the recess being on the isolation structure, such that the upper surface of the isolation structure is lower than the upper surface of the substrate, the recess exposing a sidewall of the first active region and a sidewall of the second active region. The active bridge pattern may extend across the upper surface of the isolation structure, at least a portion of the active bridge pattern being in the recess and between the isolation structure and the contact plug, and the active bridge pattern may contact the sidewall of the first active region and the sidewall of the second active region, so as to electrically couple the first active region to the second active region.

The active bridge pattern in the recess may be a silicon layer.

The silicon layer may be monocrystalline silicon or polysilicon.

At least a portion of the active bridge pattern in the recess may include a dopant.

An upper surface of the active bridge pattern may extend across an upper surface of the first active region and the second active region.

An upper surface of the active bridge pattern may be recessed below an upper surface of the first active region and an upper surface of the second active region, such that the upper surface of the silicon layer is bounded by sidewalls of the first and second active regions.

The device may further include a silicide layer between the active bridge pattern and the contact plug.

The isolation structure may be recessed in the substrate, such that the isolation structure has an upper surface that is lower than an upper surface of the substrate, a first silicon layer may extend across at least a first portion of the upper surface of the isolation structure, the first silicon layer contacting the first active region, a second silicon layer may extend across at least a second portion of the upper surface the isolation structure, the second silicon layer contacting the second active region, and the first silicon layer and the second silicon layer may be spaced apart from one another.

An upper surface of the first silicon layer may extend across an upper surface of the first active region, and an upper surface of the second silicon layer may extend across an upper surface of the second active region.

The first silicon layer and the second silicon layer may each be monocrystalline silicon.

The isolation structure may be recessed in the substrate, such that the isolation structure has an upper surface that is lower than an upper surface of the substrate, and the contact plug may extend across the upper surface of the isolation layer and may be self-aligned in the recess.

The device may further include a transistor in the first active region, a spacer on a sidewall of the contact plug, the spacer being over the first active region, and an impurity region in the first active region.

At least one of the above and other features and advantages may also be realized by providing a memory system, including a substrate having a plurality of memory cells, and a bit line on the substrate and electrically coupled to the plurality of memory cells. The substrate may have first and second active regions, the first and second active regions being disposed on opposite sides of an isolation structure, the bit line may be electrically coupled to a contact plug that is on the isolation structure between the first active region and the second active region, and the contact plug may be electrically coupled to the first active region and the second active region.

At least one of the above and other features and advantages may also be realized by providing a method of fabricating a semiconductor device, the method including forming an isolation structure that defines first and second active regions in a substrate, the first and second active regions being on opposite sides of the isolation structure, and forming a bit line electrically coupled to a contact plug, the contact plug being on the isolation structure between the first active region and the second active region, wherein the contact plug is electrically coupled to the first active region and the second active region.

The method may further include forming a recess in an upper surface of the isolation structure, such that the upper surface of the isolation structure is lower than an upper surface of the substrate so as to expose a sidewall of the first active region and a sidewall of the second active region. The contact plug may be formed in the recess.

The method may further include forming a recess in an upper surface of the isolation structure, such that the upper surface of the isolation structure is lower than an upper surface of the substrate so as to expose a sidewall of the first active region and a sidewall of the second active region, and forming a silicon layer to extend across the isolation structure, the silicon layer being formed in the recess and between the isolation structure and the contact plug. The silicon layer may contact the sidewall of the first active region and the sidewall of the second active region, so as to electrically couple the first active region to the second active region.

The method may further include forming a recess in an upper surface of the isolation structure, such that the upper surface of the isolation structure is lower than an upper surface of the substrate so as to expose a sidewall of the first active region and a sidewall of the second active region, and forming a first silicon layer extending from a first side of the recess, and forming a second silicon layer extending from a second side of the recess, the first silicon layer being separated from the second silicon layer, the first and second silicon layers being formed in the recess and between the isolation structure and the contact plug. The silicon layer may contact the sidewall of the first active region and the sidewall of the second active region.

The first and second silicon layers may be formed using an epitaxial process wherein growth of the first and second silicon layers commences at sides of the recess and progresses towards the center of the recess.

The method may further include forming a dielectric layer on the etch mask, the dielectric layer having an opening that is above the isolation structure, forming a spacer material layer on the dielectric layer and in the opening, the spacer material layer covering sidewalls of the opening and the isolation structure, and using an etch operation to form sidewall spacers from the spacer material layer and form a recess in an upper surface of the isolation structure, such that the upper surface of the isolation structure is lower than an upper surface of the substrate so as to expose a sidewall of the first active region and a sidewall of the second active region. The sidewall spacers may be on the sidewalls of the opening in the dielectric layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
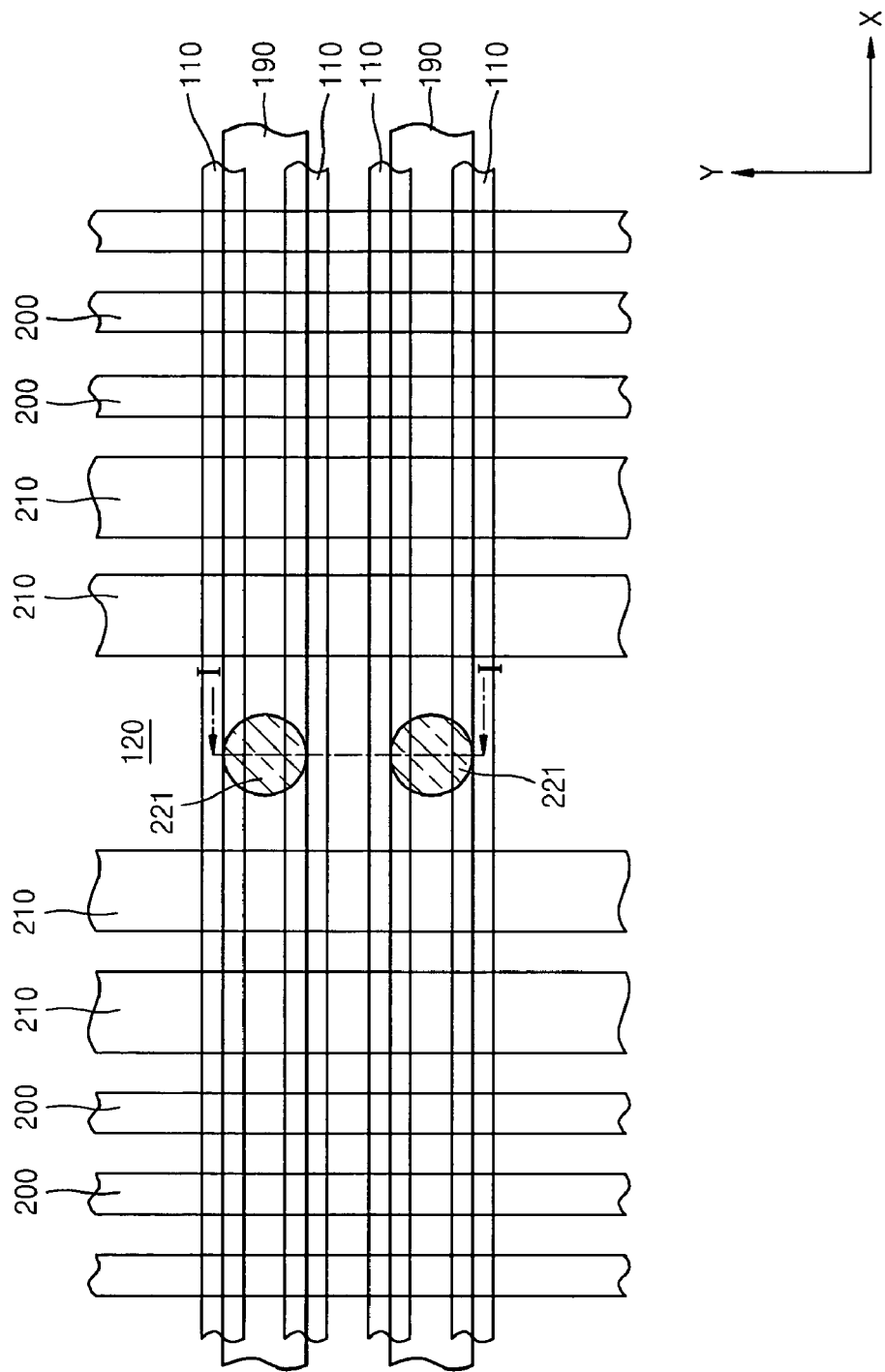
FIG. 1 illustrates a plan view showing a semiconductor device structure having a shared contact plug and a shared bitline contact plug according to an embodiment.

Korean Patent Application No. 10-2008-0059781, filed on Jun. 24, 2008, in the Korean Intellectual Property Office, and entitled: "Semiconductor Device Comprising Active Bridged Pattern and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together;

both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "a barrier metal" may represent a single compound or multiple compounds in combination.

FIG. 1 illustrates a plan view showing a semiconductor device structure having a shared bitline 190 and a shared bit line contact 221 according to an embodiment. Referring to FIG. 1, the shared bit line contact 221 connects adjacent active regions 110 and a bitline 190, such that a single shared bitline 190 may be connected to two active regions 110.

The semiconductor device may be a memory device, e.g., a flash memory device such as a NAND flash memory, that includes word lines 200 and pairs of string select lines (SSL's) 210, as well as various transistor structures (not shown).

The shared bit line contact 221 may be formed using a borderless contact method, such that the shared bit line contact 221 may be disposed on two adjacent active regions 110 and on a field region 120. The field region 120 may be defined by, e.g., a shallow trench isolation (STI) structure having an isolation layer, e.g., a field oxide, disposed in a trench 105 (see FIG. 3). The field region 120 may be between two adjacent active regions 110.

In another implementation (not shown), the shared bit line contact 221 may be disposed on only one active region 110 and a portion of the adjacent field region 120.

Figure 2A:
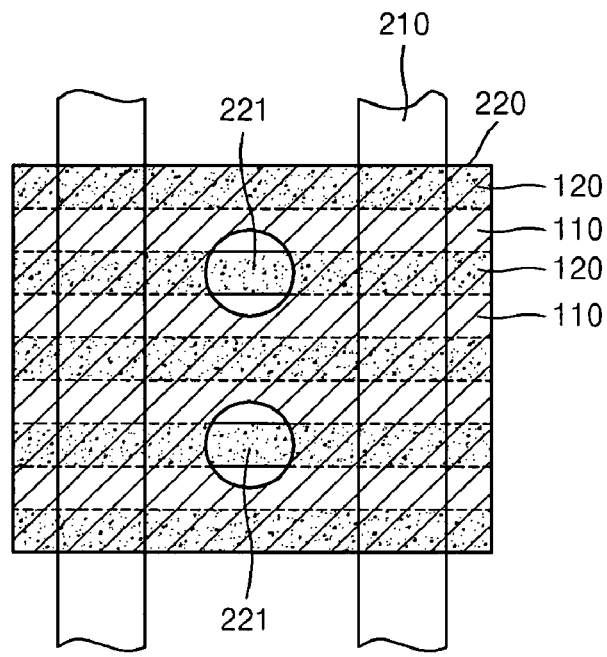
FIGS. 2A-2C illustrate plan views showing additional device structures having a shared contact plug and a shared bitline according to an embodiment.
Figure 2B:
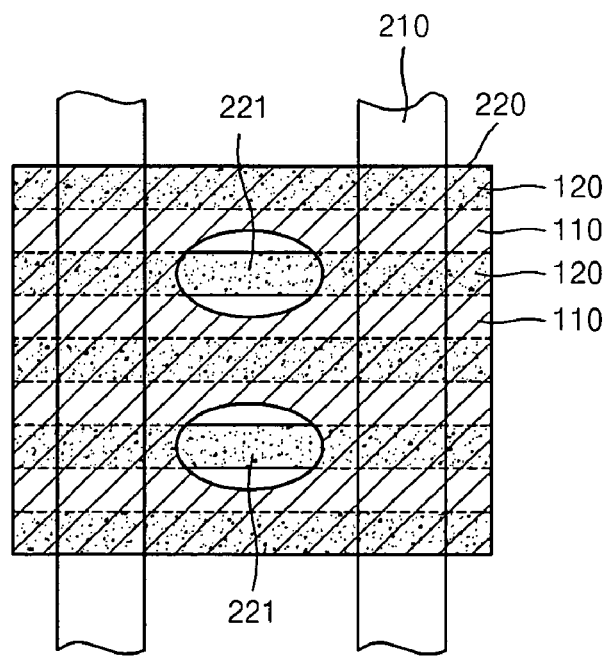
Figure 2C:
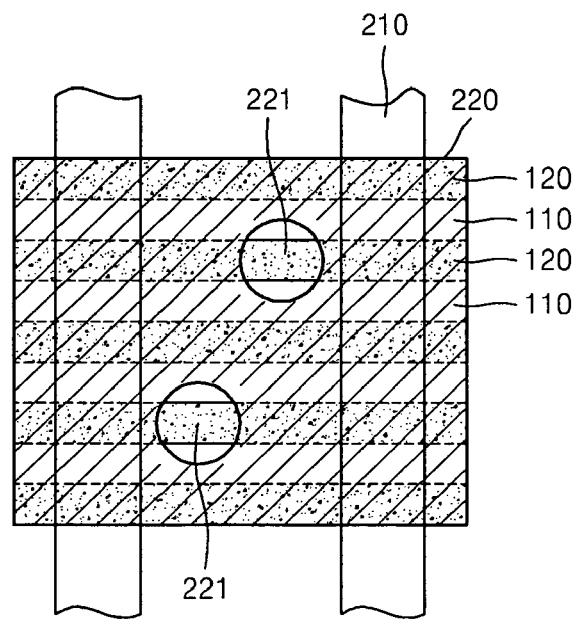

Referring to the plan views shown in FIGS. 2A-2C, additional device structures may be implemented that have shared contacts 221 and shared bit lines 190 (for clarity, the shared bit line 190 is omitted from FIGS. 2A-2C). For example, the shared bit line contact 221 may have a generally circular shape as shown in FIG. 2A, a generally elliptical shape as shown in FIG. 2B, or a generally tetragonal shape (not shown). Additionally, the shared bit line contact 221 may be disposed in-line as shown in FIGS. 2A and 2B, or in an alternating, zig-zag pattern as shown in FIG. 2C. In each case, the shared bit line contact 221 may connect two adjacent active regions 110, and may be disposed on the field region 120 between two adjacent active regions 110.

Figure 3:
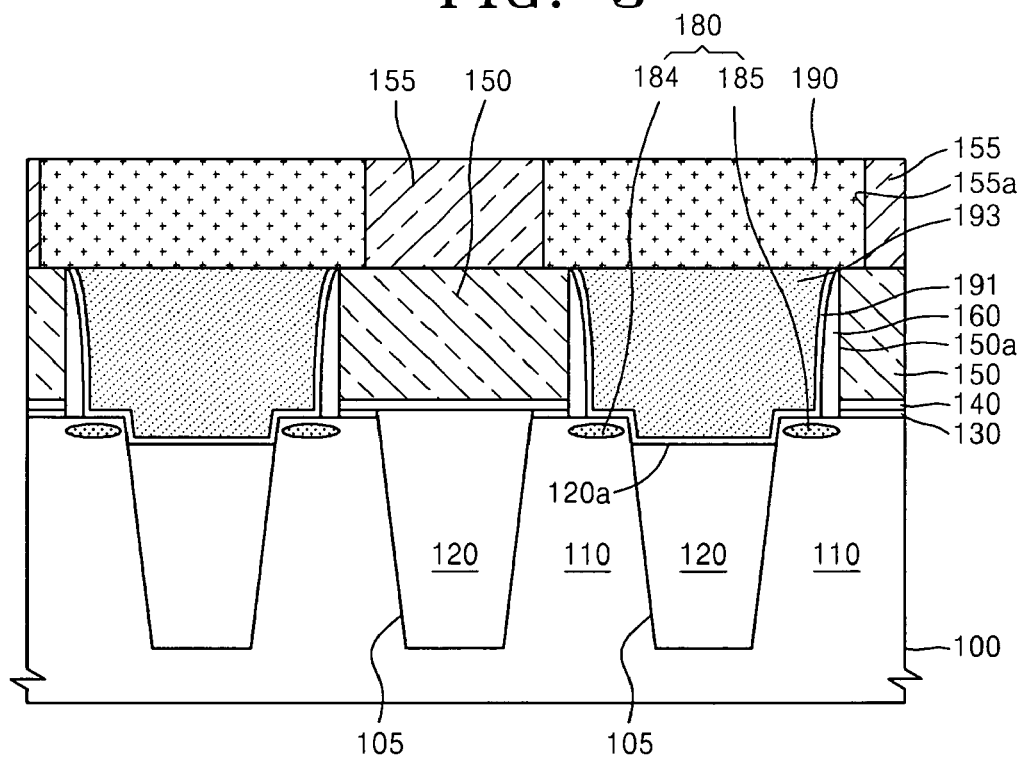
FIG. 3 illustrates a cross-sectional view of a first embodiment of the device of FIG. 1, taken along the line I-I in FIG. 1.

FIG. 3 illustrates a cross-sectional view of a first embodiment of the device of FIG. 1, taken along the line I-I in FIG. 1. Referring to FIG. 3, substrate 100 may include the active regions 110. The active regions 110 may be separated by the field regions 120.

The field regions 120 may be covered by a first interlayer dielectric (ILD) layer 150. Between the first ILD layer 150 and the underlying substrate 100, a tunneling isolation (tunnel oxide) layer 130 and then a stop layer 140, e.g., a silicon nitride (SiN) stop layer, may be sequentially stacked on the substrate 100.

An upper surface 120a of the field region 120 may be recessed with respect to an uppermost surface of the substrate 110. The recessed upper surface 120a may thus expose sidewalls of the adjacent active regions 110, thereby providing an increased contact area therewith. A shared bit line contact plug 193 formed of a conductive material, e.g., tungsten, may be on the upper surface 120a of the field region 120 and on the exposed sidewalls of the adjacent active regions 110.

As set forth in additional detail below, a patterned photoresist (not shown) formed on the first ILD 150 may expose portions of the ILD 150 overlying the field region 120 as well as portions of the adjacent active regions 110. An etch process may then be used to remove portions of the ILD 150, the stop layer 140, and underlying tunnel oxide layer 130 in the exposed region, and the etch process may be continued to form the recess in the field region 120.

Figure 4:
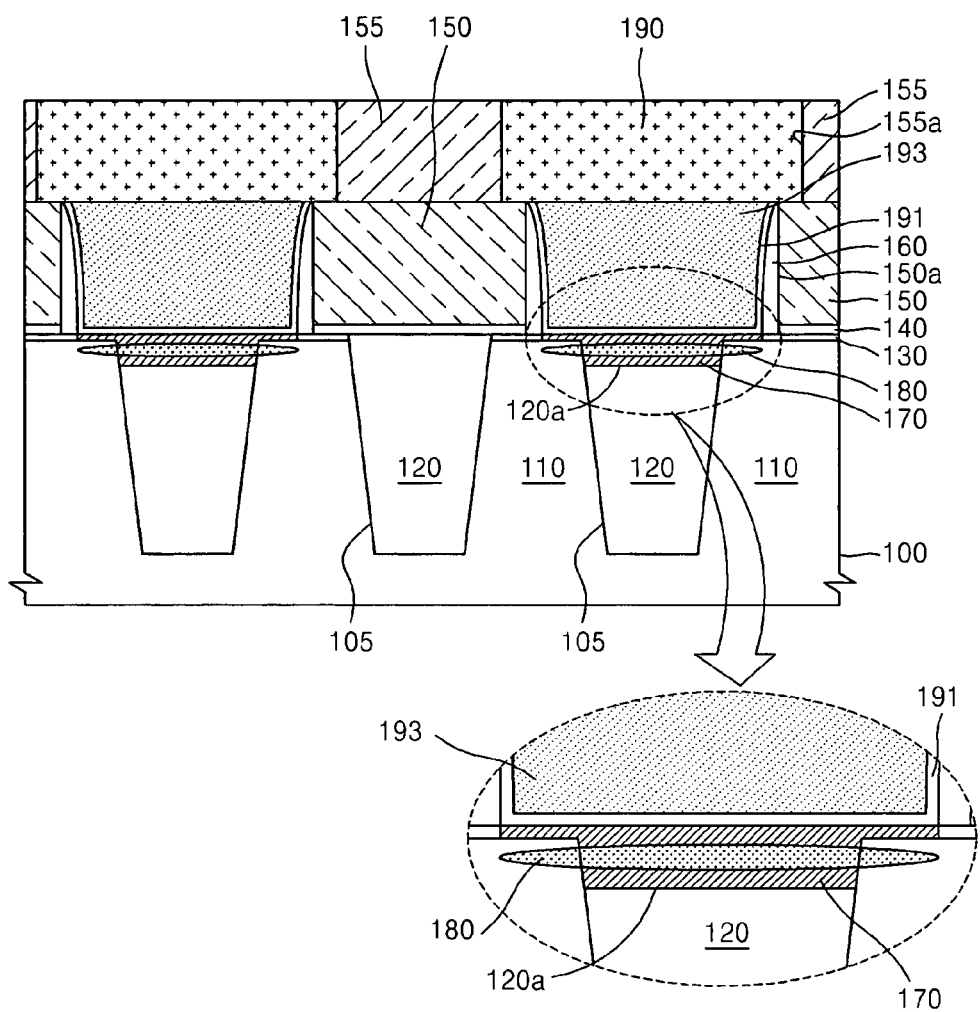
FIG. 4 illustrates a cross-sectional view of a second embodiment of the device of FIG. 1 in which an active bridged region is employed.

The shared bitline 190 is contacted to the shared bitline contact 221 and may be substantially centered on the shared bit line contact 221 and the underlying field region 120. The shared bit line contact plug 193 may extend upwards in an opening in the first ILD layer 150. Spacers 160, which may be, e.g., silicon nitride, may be disposed along sidewalls 150a of the opening in the first ILD layer 150. Depending on the order of fabrication operations, the spacer 160 may extend down to and contact the tunnel oxide layer 130, or may extend down to and contact the substrate 100 on the active region 110 (the former configuration is shown in FIG. 4; the latter configuration is shown in FIG. 3).

In an implementation, a barrier metal layer 191 may be disposed between the shared bit line contact plug 193 and the field region 120, between the shared bit line contact plug 193 and the active regions 110, and between the shared bit line contact plug 193 and the first ILD layer 150. The barrier metal layer 191 may also be disposed between the shared bit line contact plug 193 and the spacers 160. The barrier metal layer 191 may include one or more metal layers, e.g., ohmic and diffusion-prevention layers. The example of the ohmic layer and barrier metal layer may be metal and metal nitride, respectively such as Ti and TiN.

A second ILD layer 155 may be on the first ILD layer 150. The shared bit line 190 may be defined by sidewalls 155a of an opening in the second ILD layer 155. The shared bit line 190 may contact the underlying shared bit line contact plug 193 so as to be in electrical contact with two active regions 120.

In an implementation, an impurity region 180 may include at least two separate impurity regions 184 and 185 (collectively, 180), i.e., regions having doping ions implanted therein, may be formed in portions of the active regions 120 adjacent to the shared bit line contact plug 193. The spacers 160 may serve to protect transistor structures in the active regions 110, e.g., string select line transistors (not shown), during ion implantation.

The semiconductor device according to an embodiment may provide several advantages in terms of device structure and ease of manufacturing, and may scale well when critical dimensions shrink in advanced process nodes. For example, the structure may provide good contact area, thereby ensuring low contact resistance, even in the case of alignment errors, and/or may ensure increased device yields. Further, critical dimensions may be relaxed with respect to certain features, which may allow for the use of standard fabrication operations even as the device is scaled to smaller dimensions. Moreover, the structure may be formed using a reduced number of processes, e.g., photolithography steps, thereby simplifying fabrication.

FIG. 4 illustrates a cross-sectional view of a second embodiment of the device of FIG. 1 in which an active bridged region 170 is employed. Referring to FIG. 4, the upper surface 120a of the field region 120 may be recessed with respect to the uppermost surface of the substrate 100, thus exposing sidewalls of the adjacent active regions 110 to provide an increased contact area therewith. The active bridged region 170 may be disposed in the recess, such that the active bridged region 170 extends across the field region 120 and is in contact with the exposed sidewalls of the adjacent active regions 110. Thus, the active bridged region 170 may serve to electrically connect the two adjacent active regions 110.

The shared bit line contact plug 193 may be disposed on the active bridged region 170. The shared bit line contact plug 193 may be formed of a conductive material such as tungsten, polysilicon, etc.

In an implementation, the active bridged region 170 may be a polycrystalline silicon layer. In another implementation, the active bridged region 170 may be a substantially monocrystalline silicon layer formed by, e.g., selective epitaxial growth (SEG). The substantially monocrystalline silicon layer or polycrystalline layer may be implanted with impurities to control the conductivity thereof, as indicated by the impurity region 180 in FIG. 4.

Figure 5:
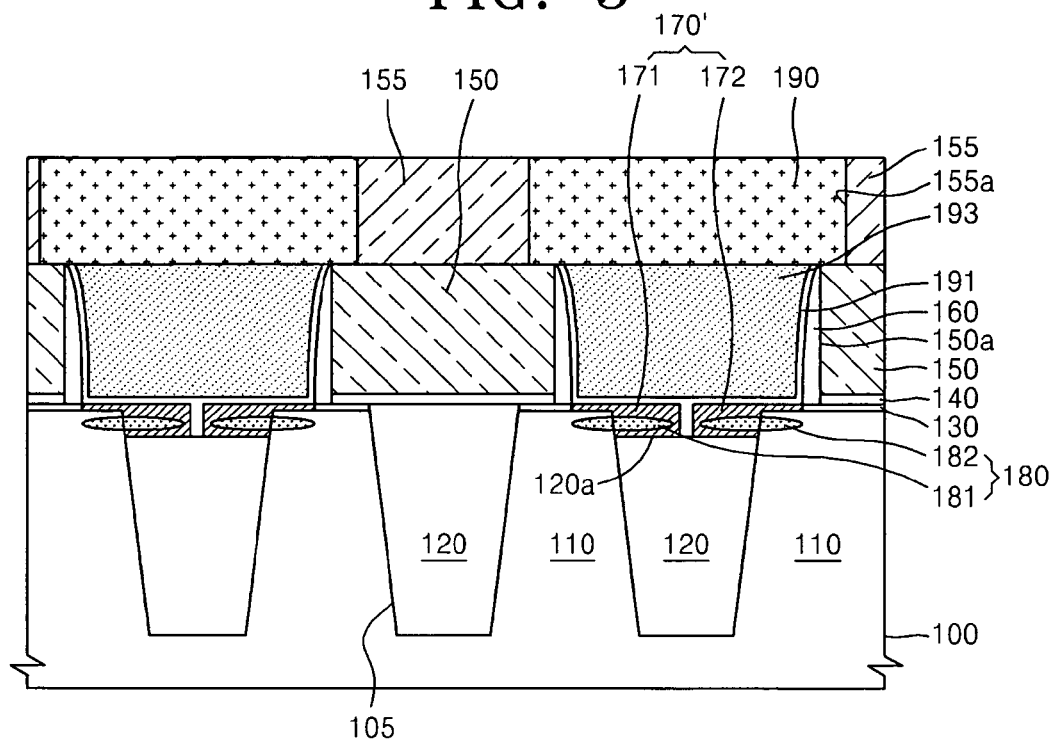
FIG. 5 illustrates a cross-sectional view of a third embodiment of the device of FIG. 1 in which a separated SAG active bridged pattern is employed.

FIG. 5 illustrates a cross-sectional view of a third embodiment of the device of FIG. 1 in which a separated SEG active bridged pattern 170' is employed. The active bridged region 170' may include opposing portions 171 and 172, which may be separated by a gap therebetween. The portions 171 and 172 may be formed by SEG. In the SEG process, crystal growth from the laterally opposed sidewalls of the adjacent active regions 110 toward the center of the field region 120 may be stopped before the portions 171 and 172 join.

In an implementation, the portions 171 and 172 of the active bridged pattern 170' may be doped using ion implantation to form respective impurity regions 181 and 182.

Figure 6:
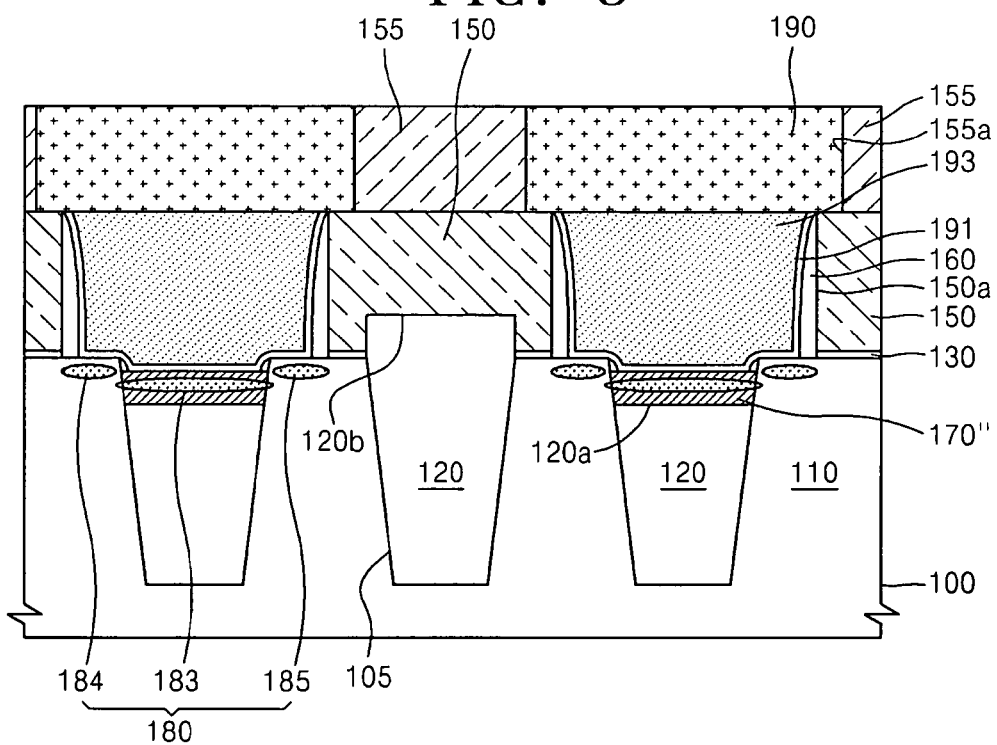
FIG. 6 illustrates a cross-sectional view of a fourth embodiment of the device of FIG. 1 in which a recessed active bridged pattern is employed.

FIG. 6 illustrates a cross-sectional view of a fourth embodiment of the device of FIG. 1 in which a recessed active bridged pattern 170" is employed. The recessed active bridged region 170" may have an upper surface that is lower than the uppermost surface of the substrate 100, i.e., lower than the upper surfaces of the adjacent active regions 110. In this case, the active bridged region 170 may be formed by using polysilicon rather than SEG. By way of comparison, in the device shown in FIG. 4, the polysilicon or SEG active bridged region 170 may extend across the uppermost surface of the substrate 110 on regions adjacent to the recess, as shown in the inset in FIG. 4.

Ion implantation may be used to form the impurity region 180, here including three impurity regions 183, 184, and 185. Further, the field region 120 that is not under the recessed active bridged region 170" may extend above the substrate 100, i.e., upper surface 120b of the field region that is not under the recessed active bridged pattern 170" may be above the upper surface of the substrate 100. Further, the upper surface 120b may be above the tunnel oxide layer 130 on the substrate 100. The stop layer 140 may be omitted, as described below in connection with FIGS. 13A-M. As explained below, forming the structure shown in FIG. 6 to have a recessed active bridged pattern 170" may allow for a simplified fabrication process to be employed.

Figure 7:
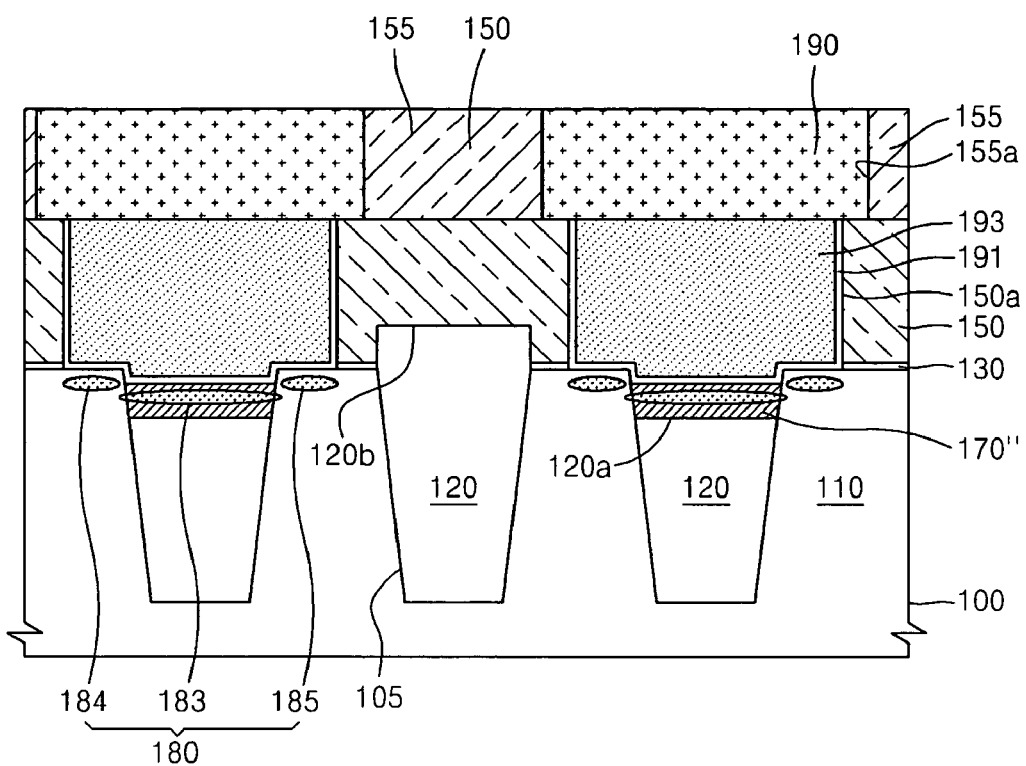
FIG. 7 illustrates a cross-sectional view of a fifth embodiment of the device of FIG. 1 in which a recessed active bridged pattern without sidewall spacers is employed.

FIG. 7 illustrates a cross-sectional view of a fifth embodiment of the device of FIG. 1 in which the recessed active bridged pattern 170" is employed without sidewall spacers. The recessed active bridged region 170" may have an upper surface that is lower than the uppermost surface of the substrate 100, i.e., lower than the upper surfaces of the adjacent active regions 110. The active bridged region 170 may be formed using polysilicon or monocrystalline silicon, for example, by SEG. In case of using polysilicon, active, further treatment such as heat treatment may be further applied so as to transform polycrystalline to monocrystalline. Ion implantation may be used to form impurity regions 183, 184 and 185. Further, the upper surface 120b of the field region 120 that is not under the recessed active bridged region 170" may be above the substrate 100, and the stop layer 140 may be omitted. Sidewalls spacers, such as spacers 160 in FIG. 6, may also be omitted. Sidewall spacers may block other impurities or dopants from passing through sidewalls.

Figure 8:
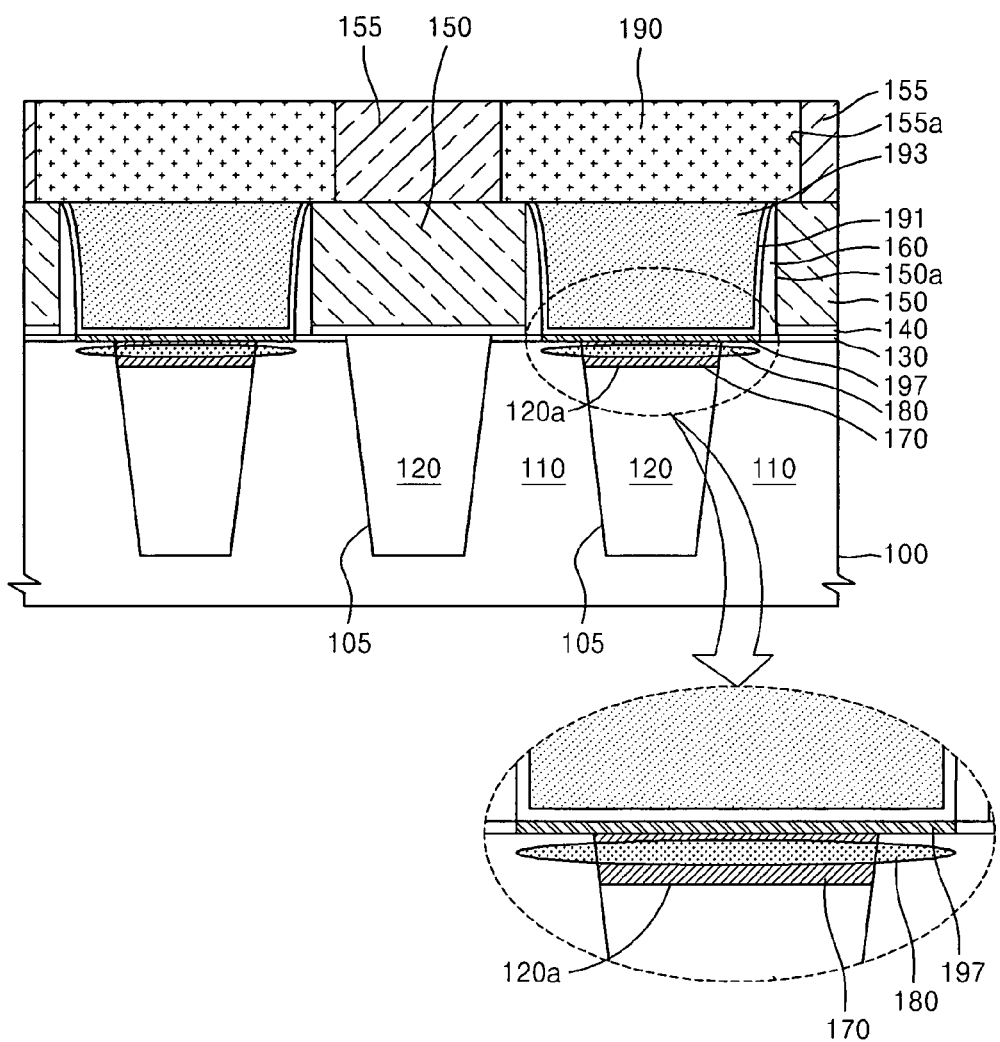
FIG. 8 illustrates a cross-sectional view of a sixth embodiment of the device of FIG. 1 in which an active bridged pattern with a salicide layer is employed.

FIG. 8 illustrates a cross-sectional view of a sixth embodiment of the device of FIG. 1 in which the active bridged pattern 170 is employed with a salicide layer. The embodiment illustrated in FIG. 8 may be similar to the second embodiment illustrated in FIG. 4. Accordingly, the description of features similar to those in FIG. 4 may not be repeated for clarity.

The active bridged pattern 170 may be formed of a silicon-containing material, e.g., polysilicon, crystalline silicon formed using SEG, etc. Referring to FIG. 8, a salicide (self-aligned silicide) layer 197 may be formed at an upper region of the active bridged pattern 170. In an implementation, the salicide layer 197 may be formed by depositing a metal on the active bridged pattern 170. In the case that a metal is deposited on the active bridged pattern, the metal may be, e.g., a transition metal such as cobalt, nickel, titanium. Formation of the salicide $CoSi_2$ in the salicide layer 197 may be driven by heat treatment, e.g., using an annealing operation. The salicide layer 197 may provide a lower contact resistance and may also serve as a diffusion barrier.

Excess metal may be removed from the salicide layer 197 and/or adjacent regions using, e.g., a wet etch operation, leaving the salicide layer 197. In addition, barrier metal(s), e.g., titanium/titanium nitride layers, may be deposited to form barrier metal layer 191 on the salicide layer 197. The shared bit line contact plug 193 formed of a conductive material, e.g., tungsten, may be formed on the barrier metal layer 191.

Figure 9:
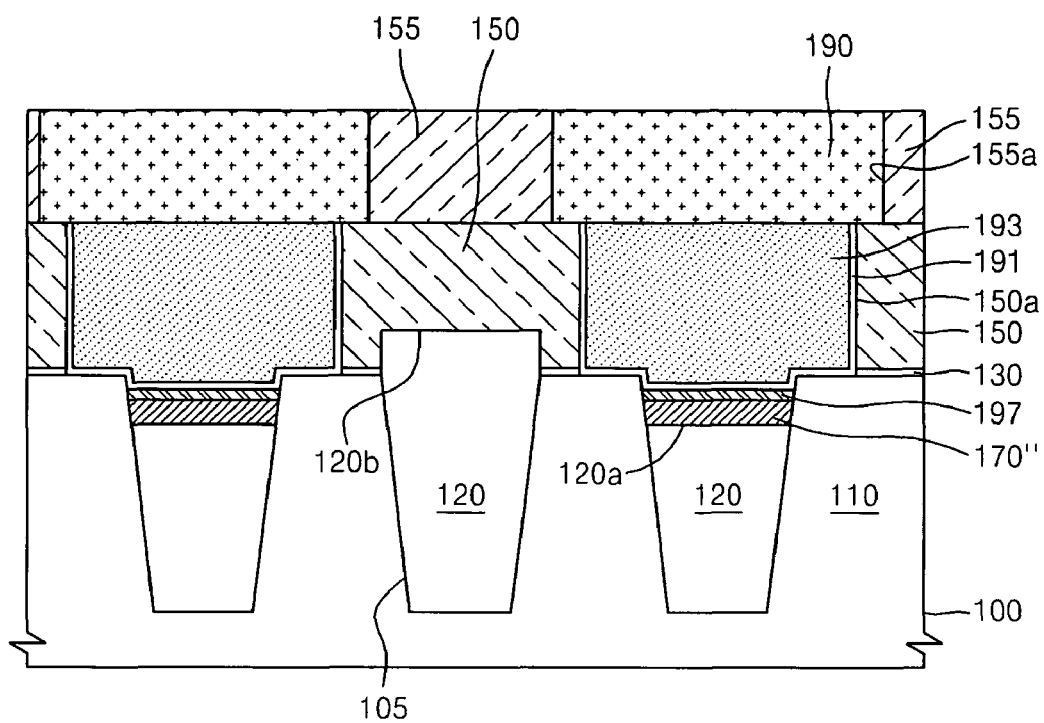
FIG. 9 illustrates a cross-sectional view of a seventh embodiment of the device of FIG. 1 in which a recessed active bridged pattern without sidewall spacers and having a salicide layer is employed.

FIG. 9 illustrates a cross-sectional view of a seventh embodiment of the device of FIG. 1 in which the recessed active bridged pattern 170" is employed without sidewall spacers and with a salicide layer. Referring to FIG. 9, salicide layer 197 may be formed on the recessed active bridged pattern 170".

Below, operations which may be used to form structures such as those described in connection with the first through seventh embodiments will be described.

Figure 10A:
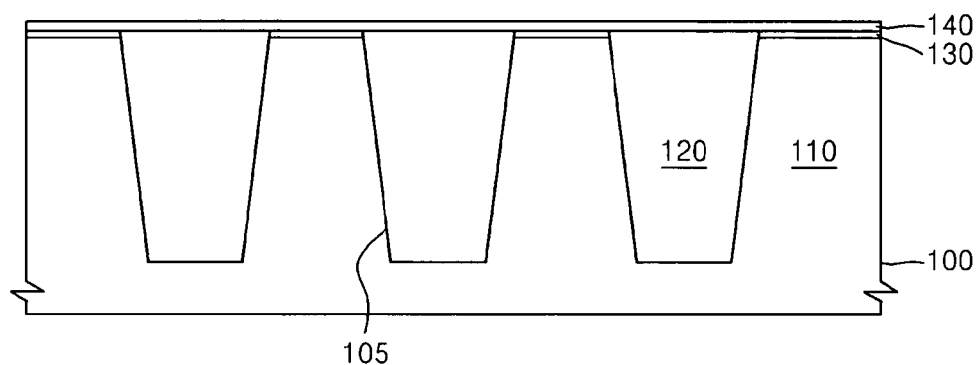
FIGS. 10A-H illustrate cross-sectional views of stages in a method of fabricating a device according to an eighth embodiment.

FIGS. 10A-H illustrate cross-sectional views of stages in a method of fabricating a device according to an eighth embodiment. Referring to FIG. 10A, the trenches 105 may be formed to define active regions 110. The trenches 105 may be formed by, e.g., photolithography. An insulating material may be deposited in the trenches 105 to form the field regions 120. The field regions 120 may thus separate active regions 110. The upper surfaces of the field regions 120 may be higher, lower, or the same height as the upper surfaces of the active regions 110.

Devices, e.g., active devices such as transistors, flash memory cells, etc., may be formed on the active regions 120. During formation of the active devices, a tunnel oxide layer 130 may be formed on the substrate, and an etch stop layer, e.g., SiN, may be formed on the tunnel oxide layer 130.

Figure 10B:
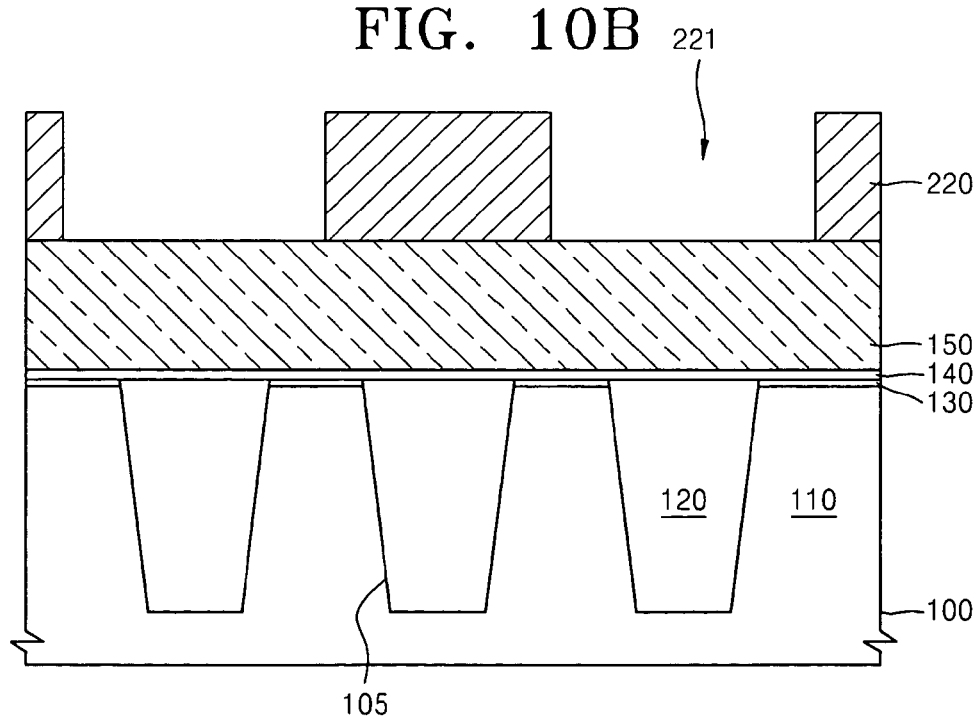

After formation of the active devices is completed (not shown), an insulating layer may be formed on the substrate to create the first ILD layer 150, as shown in FIG. 10B. In an implementation, a protective layer (not shown), e.g., SiN, may be formed on the first ILD layer 150 to protect it from etching.

Next, a photoresist layer 220 patterned to have openings 221 therein may be formed. The openings 221 may be located so that subsequent etch operations through the openings 221 expose portions of the field regions 120.

Figure 10C:
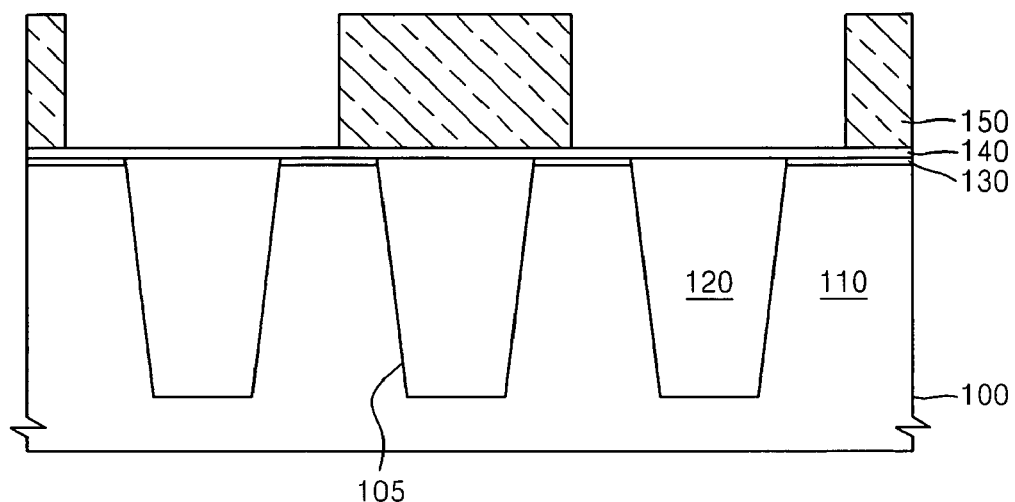

Referring to FIG. 10C, portions of the first ILD layer 150 that are exposed by the openings 221 in the photoresist layer 220 may be selectively etched to form openings in the first ILD layer 150. The photoresist layer 220 may serve as a mask during etching. The openings 221 may have a width sufficient to expose not only the field regions 120, but also portions of one or both adjacent active regions 110.

Figure 10D:
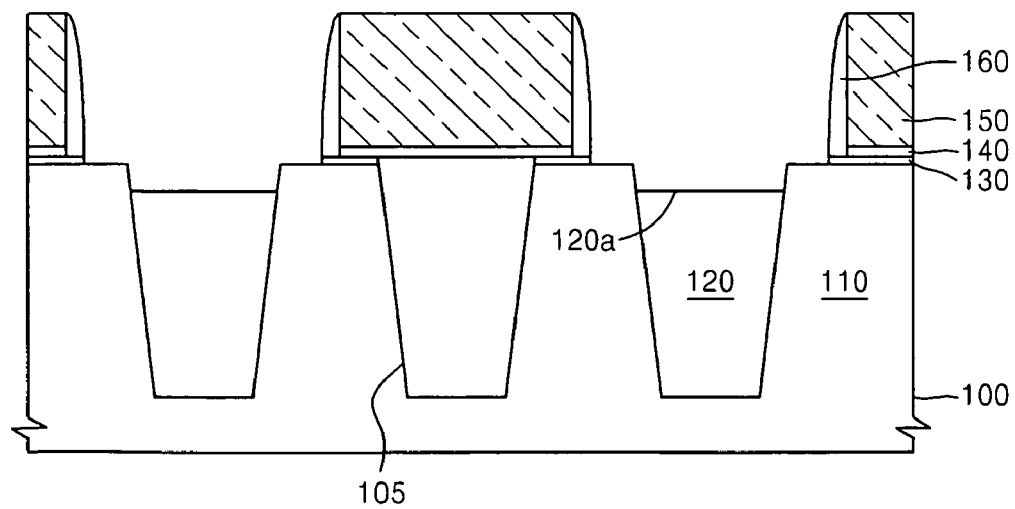

Referring to FIG. 10D, in an implementation, spacers 160 may be formed on lateral walls of the openings in the first ILD layer 150. The spacers 160 may serve to protect active devices, e.g., transistors used for string select lines, under the first ILD layer 150 against ions during a subsequent ion implantation operation. The spacers 160 may be formed by, e.g., depositing an insulating material on the entire surface of the substrate and then etching back the insulating material to leave the spacers 160 on the lateral walls.

As shown in FIG. 10D, recesses may be formed at bottoms of the openings in the first ILD layer 150. As described in detail below, the recesses may expose side surfaces of the active regions 110, and may thus provide an increased contact area for the formation of an active bridged pattern. The exposed side surfaces may also provide sites for the initiation of selective lateral overgrowth of a substantially crystalline silicon layer for the active bridged pattern.

The recesses may be formed by one or more etching operations that remove the exposed etch stop layer 140 and upper portions of the field regions 120. In an implementation, a first etching operation may be performed before forming the spacers 160, the first etching operation removing the exposed etch stop layer 140. The tunnel oxide layer 130 may not be removed before the spacers 160 are formed, and, thus, may extend under the spacers 160. After forming the spacers, a second etching operation may be performed to remove the portion of the tunnel oxide layer 130 exposed by the spacers 160, as well as the upper region of the underlying field region 120.

Figure 10E:
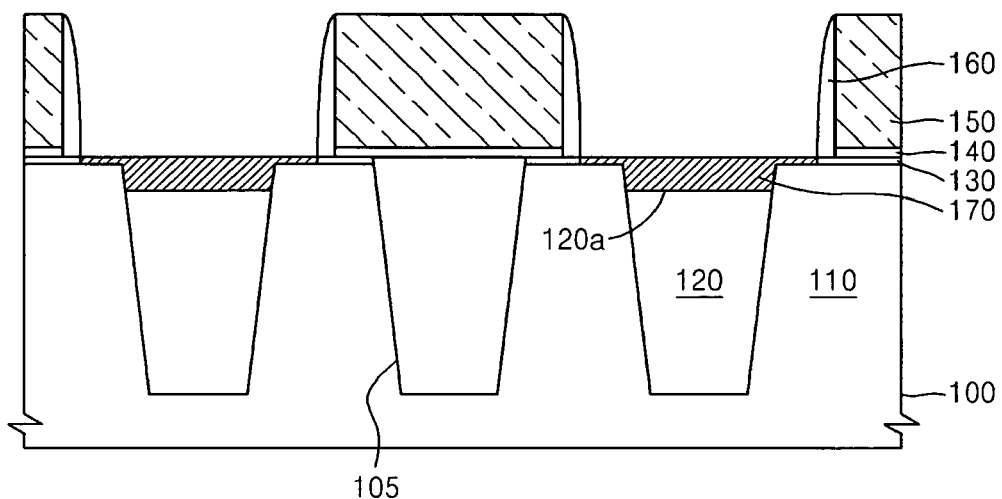

Referring to FIG. 10E, active bridged patterns 170 may be formed in the recesses. In an implementation, the active bridged patterns 170 may extend across exposed upper surfaces of the active regions 110 adjacent to the recesses. The active bridged patterns 170 may be formed by selective epitaxial growth, in which case the active bridged patterns 170 may be substantially monocrystalline. The selective epitaxial growth may commence at the exposed portions of the active regions 110 and progress across the field regions 120 from either side of the field regions. In an implementation, the selective epitaxial growth may be terminated before the growth from opposing sides joins, so as to form a structure as shown in FIG. 5. Otherwise, growth may be continued until the growth from opposing sides joins, so as to form a structure as shown in FIG. 10E.

The selective epitaxial growth may result in active bridged patterns 170 that are swollen, i.e., thicker, in the center, i.e., near the middle of the corresponding field regions 120. An etch back process may be employed to reduce the thickness of the active bridged patterns 170.

Figure 10F:
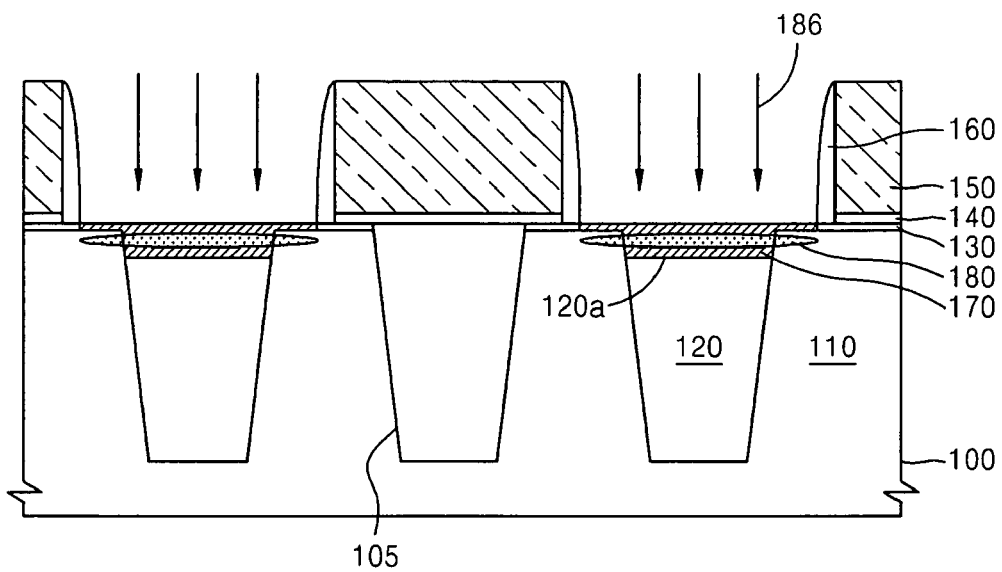

Referring to FIG. 10F, the active bridged patterns 170 may be modified by doping impurities into the active bridged patterns 170 using an ion implantation process. Ion implantation may form the ion implantation region 180. In an implementation, the ion implantation region may be formed as separate regions, as shown in FIGS. 3, 5, 6, and 7 (regions 183, 184, 185), in accordance with a depth of the layer to be implanted.

Figure 10G:
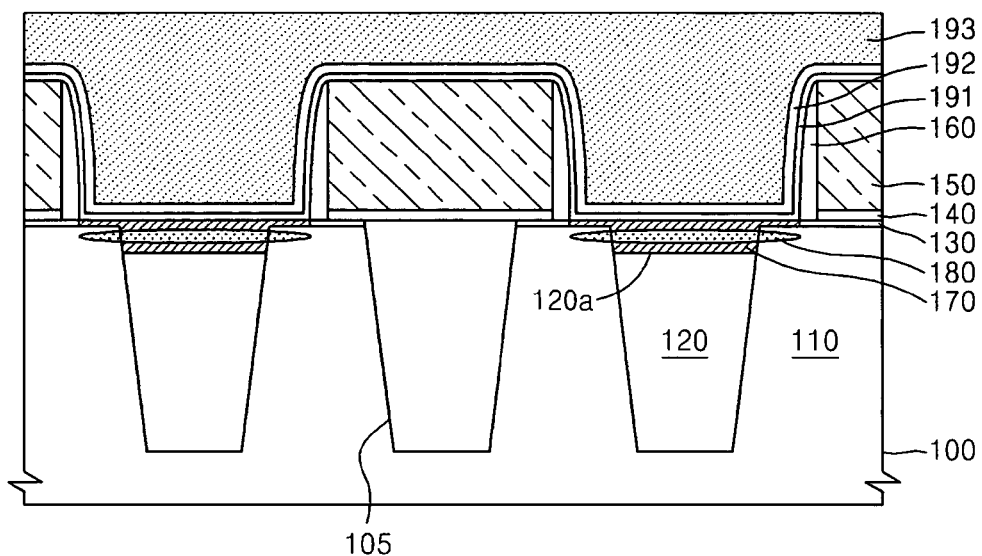

Referring to FIG. 10G, one or more barrier metal layers, e.g., the barrier metal layer 191 and a second barrier metal layer 192, may be deposited on the active bridged patterns 170 and on sidewalls of the openings in the first ILD layer 150. The barrier metal layers 191, 192 may be ohmic and diffusion-prevention layers. Conductive material, e.g., tungsten, polysilicon, etc., may be formed on the openings in the first ILD layer 150 and on the barrier metal layers 191, 192 so as to form the shared bit line contact plug 193. In an implementation, the conductive material may be applied to the entire substrate, as shown in FIG. 10G, and then etched back or planarized by chemical mechanical polishing ("CMP") to yield the structure shown in FIG. 10H. In another implementation, photolithography and etching may be used to pattern the conductive material.

Figure 10H:
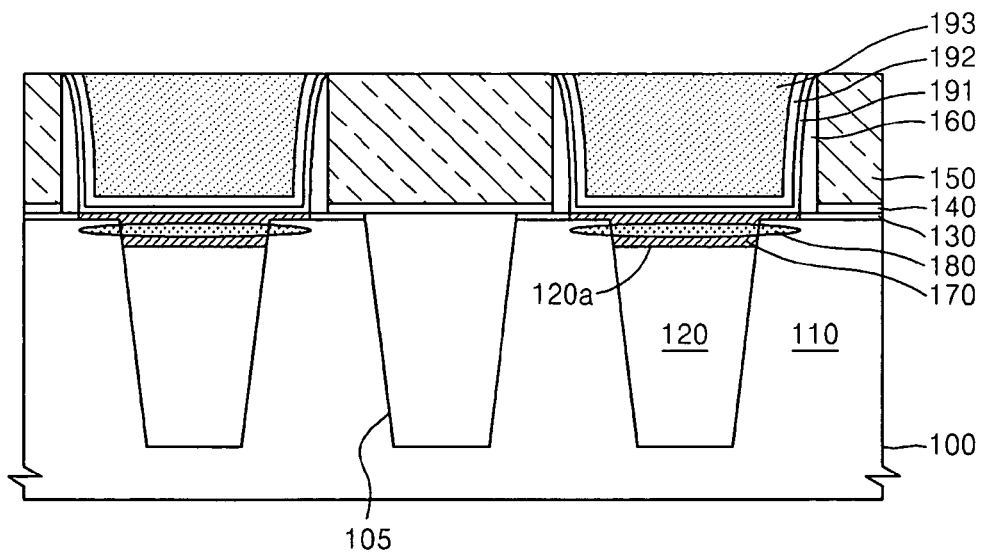

As shown in FIG. 10H, the single shared bit line contact plug 193 may connect to multiple active regions 120. In another implementation (not shown), only a single active region 120 may be connected, or the shared bit line contact plug 193 may be connected to active regions 120, without an intermediate active bridged pattern 170.

Figure 11:
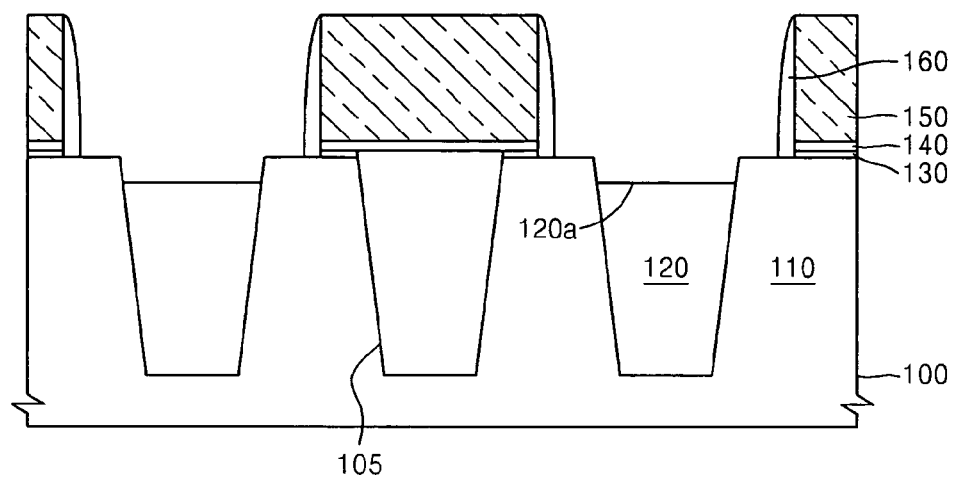
FIG. 11 illustrates a cross-sectional a view of a variation in the method illustrated in FIGS. 10A-H.

FIG. 11 illustrates a cross-sectional a view of a variation in the method illustrated in FIGS. 10A-H. In particular, FIG. 11 illustrates a variation on the operation shown in FIG. 10D. As shown in FIG. 11, the spacers 160 may be formed after the recesses are formed at bottoms of the openings in the first ILD layer 150. In this case, the etch stop layer 140 may be removed across a full width of the openings in the first ILD layer 150. Subsequent formation of the spacers 160 may result in the spacers 160 contacting the tunnel oxide layer 130. By comparison, the spacers 160 may be separated from the tunnel oxide layer 130 by the etch stop layer 140 in the structure shown in FIG. 10D.

Figure 12A:
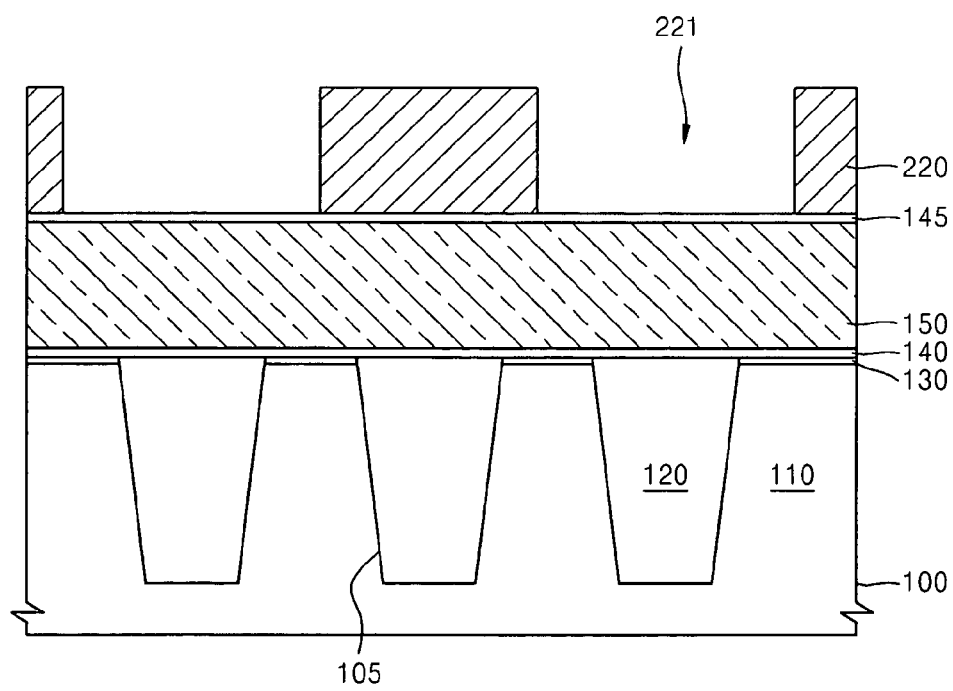
FIGS. 12A-D illustrate cross-sectional views of another variation in the method illustrated in FIGS. 10A-H.

FIGS. 12A-D illustrate cross-sectional views of another variation in stages of the method illustrated in FIGS. 10A-H. Referring to FIG. 12A, a protective layer 145, e.g., silicon nitride, may be formed on the first ILD layer 150. The photoresist layer 220 may be formed on the protective layer 145 and patterned to form the openings 221 in the photoresist layer. The openings 221 may expose the protective layer 145. By comparison, the structure shown in FIG. 10B omits the protective layer 145.

Figure 12B:
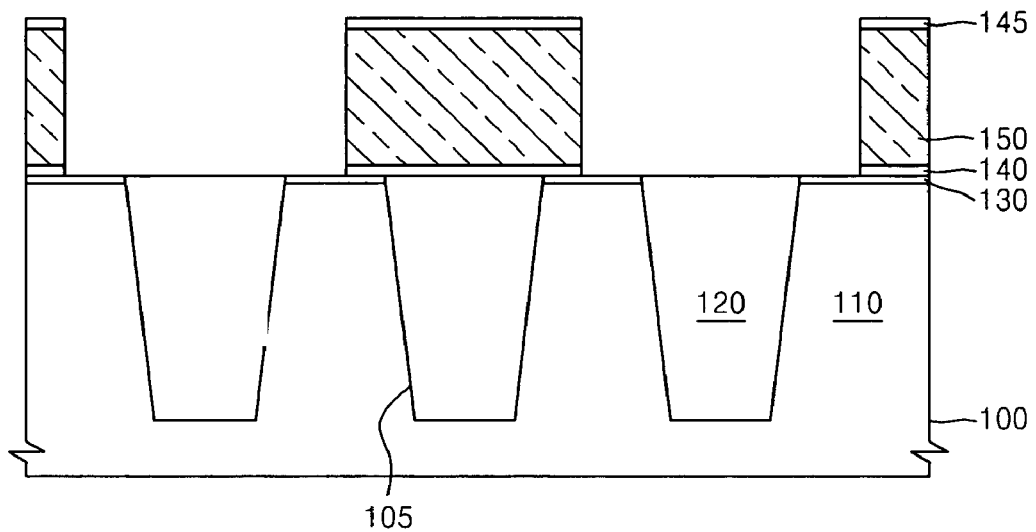

Referring to FIG. 12B, an etch process may be used to remove the exposed protective layer 145 and the underlying first ILD layer 150, as well as the underlying etch stop layer 140. The etch process may not remove the underlying tunnel oxide layer 130.

Figure 12C:
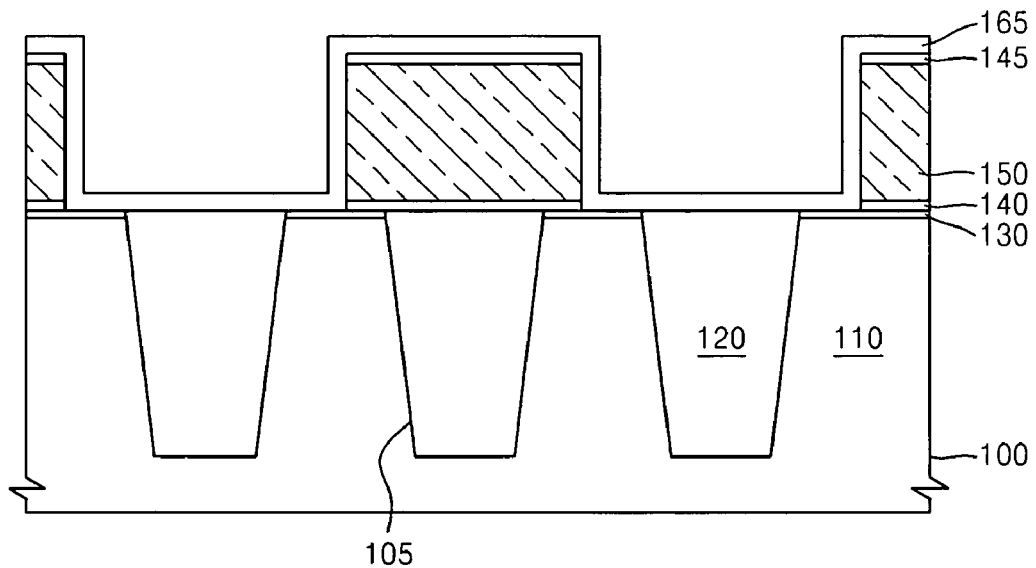

Referring to FIG. 12C, a spacer material 165, e.g., SiN, may be formed on the substrate, e.g., using a conformal deposition process, to cover the exposed sidewalls of the first ILD layer 150, the exposed tunnel oxide layer 130, and the exposed field region 120 at the bottom of the opening.

Figure 12D:
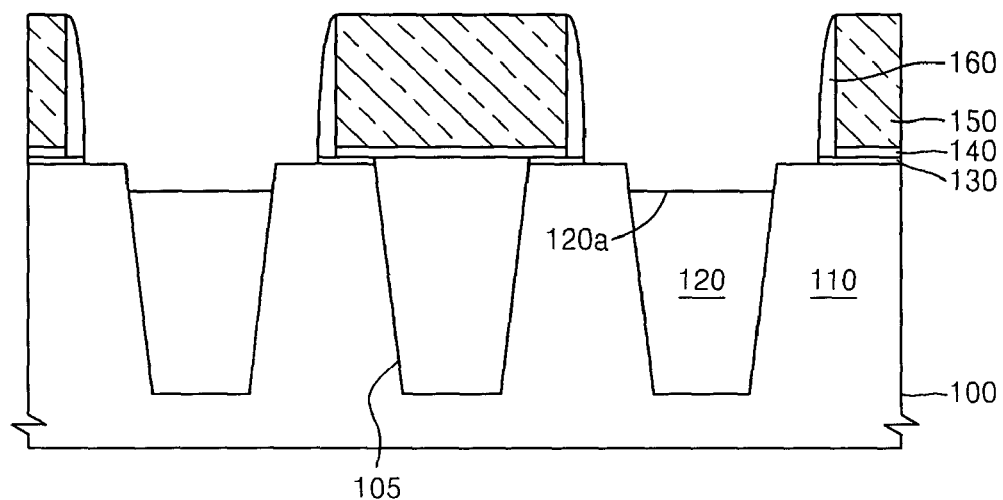

Referring to FIG. 12D, an etching operation may be used to form the spacers 160 by removing the spacer material from the upper surface of the first ILD 150 and the bottom of the opening. The etching operation may also remove the protective layer 145 from the upper surface of the first ILD 150. The etching operation may be continued to remove the exposed portion of the tunnel oxide 130 that is not covered by the spacers 160, and etching may be continued to partially remove the upper region of the field region 120 so as to form a recess between adjacent active regions 110. Where the etching operation removes the protective layer 145 from the upper surface of the first ILD layer 150, the thickness of the first ILD layer 150 may be reduced by the etchant. The thickness of the initially-formed first ILD layer 150 may thus be adjusted accordingly.

Figure 13A:
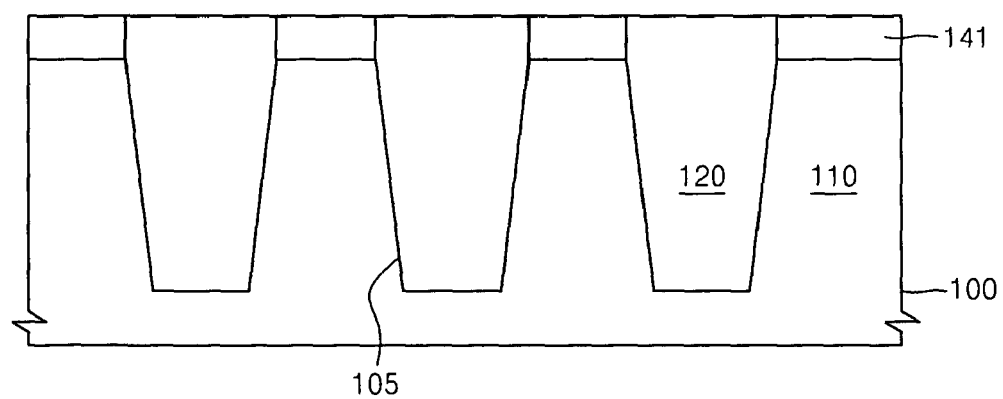
FIGS. 13A-M illustrate cross-sectional views of stages in a method of fabricating a device according to a ninth embodiment.

FIGS. 13A-M illustrate cross-sectional views of stages in a method of fabricating a device according to a ninth embodiment. Referring to FIG. 13A, an etch stop material, e.g., SiN, may be formed on the substrate 100 and patterned to form etch stop regions 141. The etch stop regions 141 may be used as a mask to etch trenches 105 in the substrate 100. The trenches may be filled with a field oxide material. A CMP process may be used to remove the field oxide material to the level of the upper surfaces of the etch stop regions 141 so as to form the field regions 120.

Figure 13B:
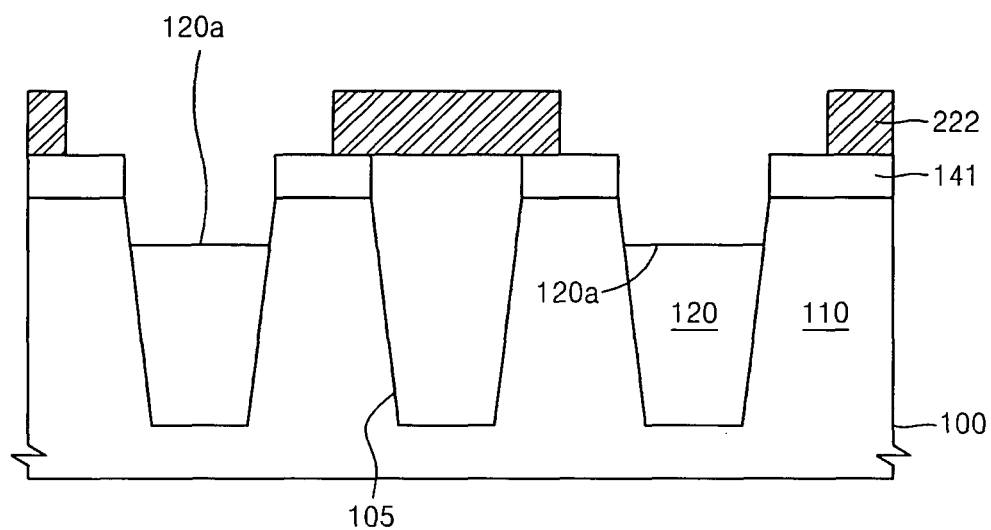

Referring to FIG. 13B, a photoresist layer may be formed and then patterned to yield a photoresist pattern 222 that exposes the field regions 120 as well as portions of the adjacent active regions 110. The photoresist pattern 222 may be used as an etch mask during an etching process that removes the upper portion of the exposed field regions 120 so as to form recesses that expose sidewalls of the adjacent active regions 110.

Figure 13C:
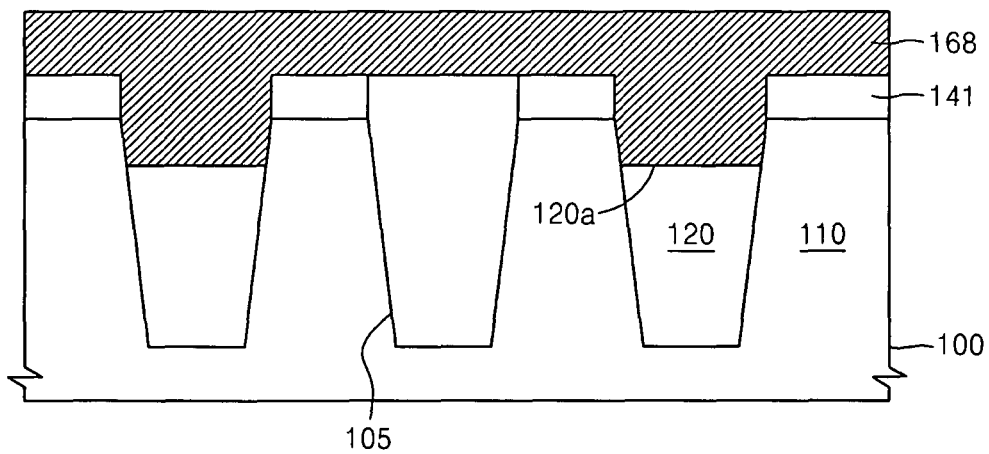

Referring to FIG. 13C, a conductive material 168 may be formed to fill the recesses above the field regions 120. The conductive material 168 may be formed on the entire substrate 100. The conductive material 168 may be, e.g., polysilicon.

Figure 13D:
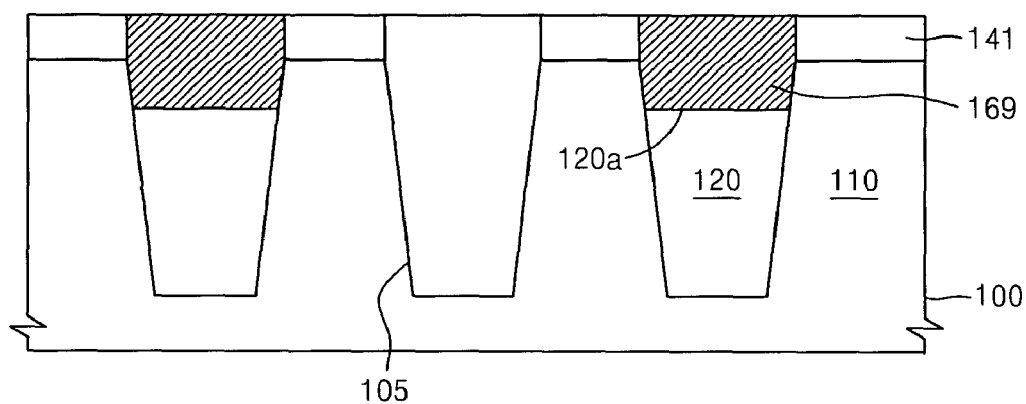

Referring to FIG. 13D, the conductive material 168 may be planarized, e.g., using CMP, to form preliminary active bridged patterns 169. The preliminary active bridged patterns 169 may be reduced in thickness by a subsequent operation (described below) so as to form the active bridged patterns 170.

Figure 13E:
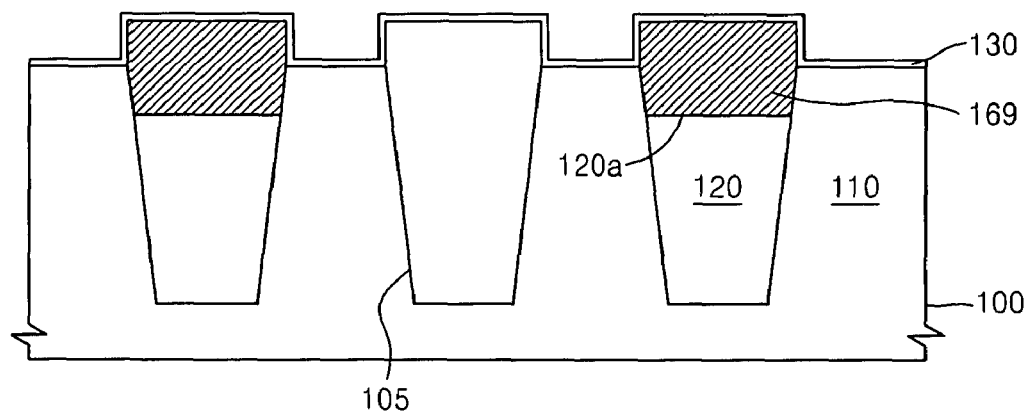

Referring to FIG. 13E, the etch stop regions 141 may be removed. The tunnel oxide 130 may be formed on the entire surface of the substrate 100. The tunnel oxide 130 may be formed wherever exposed silicon is present, e.g., on the active regions 110, using a thermal oxidation process, a plasma oxidation process, etc.

Figure 13F:
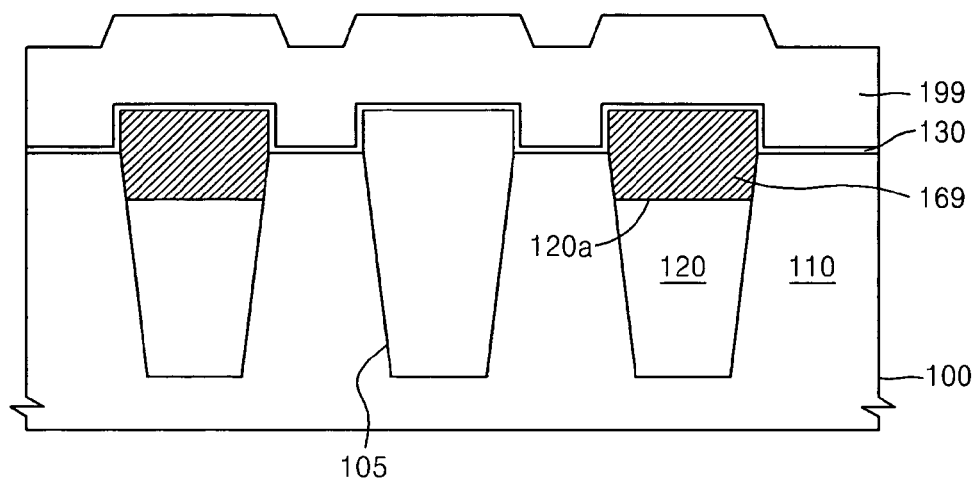

Referring to FIG. 13F, a conductive material 199, e.g., polysilicon, may be formed on the entire surface of the substrate 100. As described below, the conductive material 199 may be used to form floating gates.

Figure 13G:
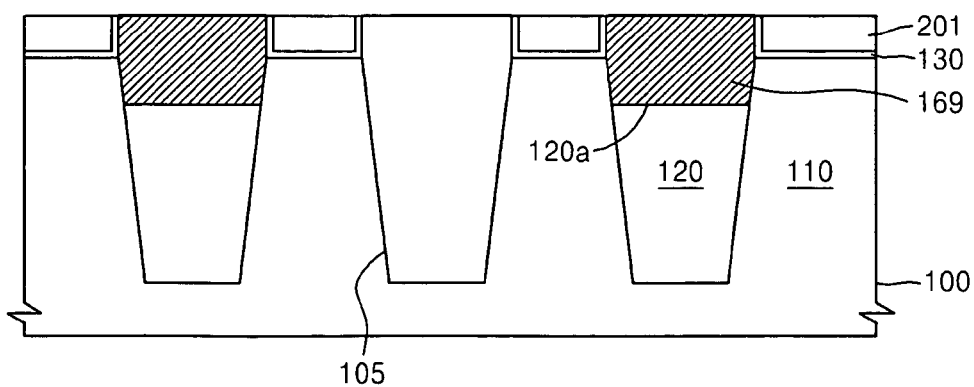

Referring to FIG. 13G, the conductive material 199 may be etched, e.g., using CMP or an etch back process, to form conductive material patterns 201. Intergate dielectric layer, e.g., an ONO (oxide/nitride/oxide) material, and a control gate conductive layer (not shown) may be formed on the substrate 100 having preliminary active bridged patterns and the polysilicon conductive material patterns 201, and then removed completely around the string select lines 210 and contact areas using, e.g., a photolithographic operation in which a patterned photoresist is used as an etch mask Referring to FIG. 13H, the removing operation may be continued to expose the preliminary active bridged patterns 169 under the tunnel oxide.

Figure 13H:
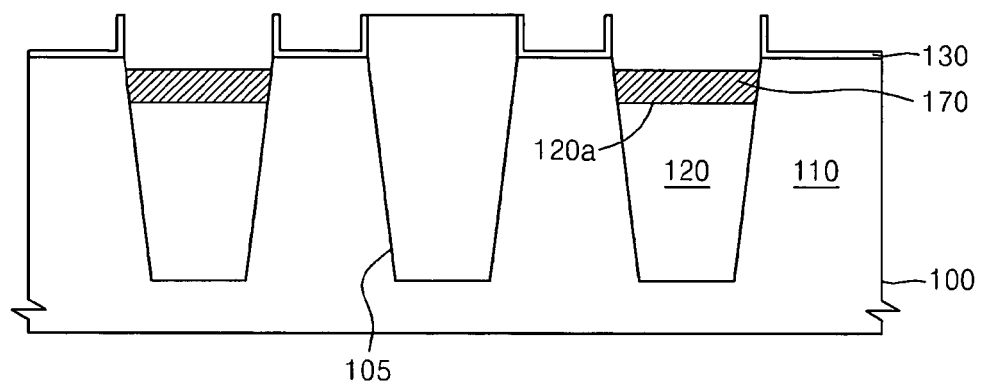

A dry etching operation may also reduce the thickness of the polysilicon preliminary active bridged patterns 169 so as to form the active bridged patterns 170. As shown in FIG. 13H, a field region 120 between adjacent active bridged patterns 170 may project above the uppermost surfaces of the adjacent active bridged patterns 170.

Figure 13I:
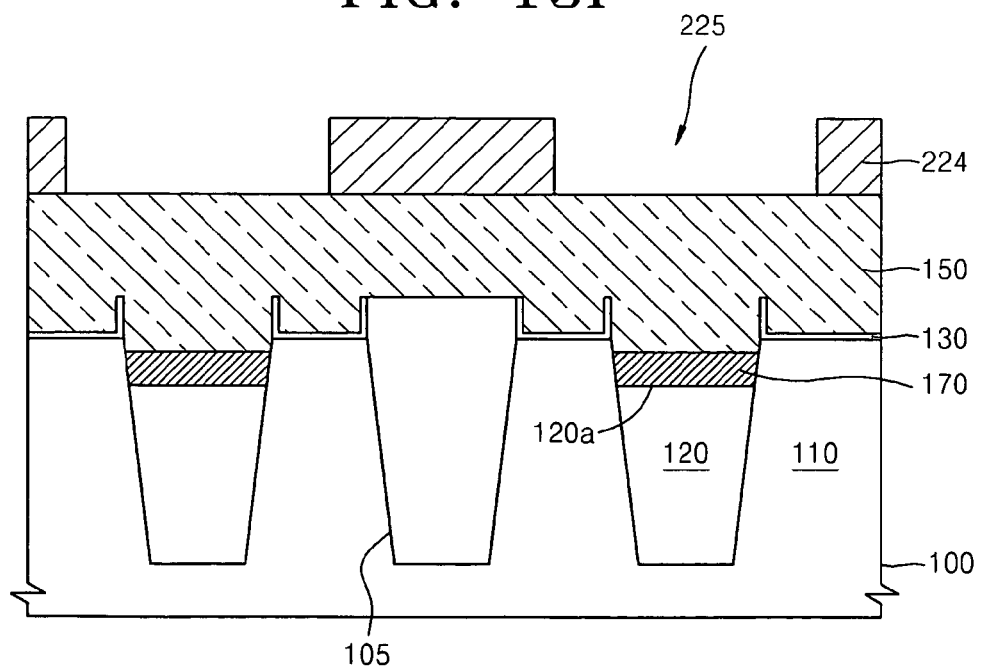

Referring to FIG. 13I, an insulating material, e.g., an oxide material such as silicon oxide, may be formed on the substrate 100 in order to make the first ILD layer 150. The oxide material of the first ILD layer 150 may be the same material used for the tunnel oxide 130. A photoresist layer may be formed on the first ILD layer 150 and then patterned to form a second photoresist pattern 224 having openings 225 therein. The openings 225 may correspond to regions where the shared bit line contact plugs 193 will be formed to connect to the active bridged patterns 170.

Figure 13J:
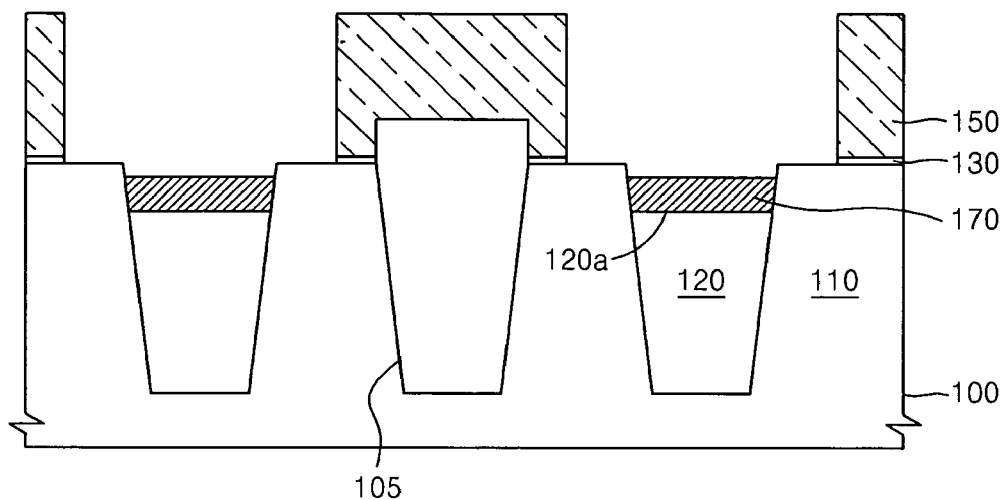

Referring to FIG. 13J, regions of the first ILD layer 150 exposed by the second photoresist pattern 224 may be removed. Corresponding regions of the tunnel oxide 130 may also be removed so as to expose the active bridged patterns 170 as well as portions of the adjacent active regions 110.

Figure 13K:
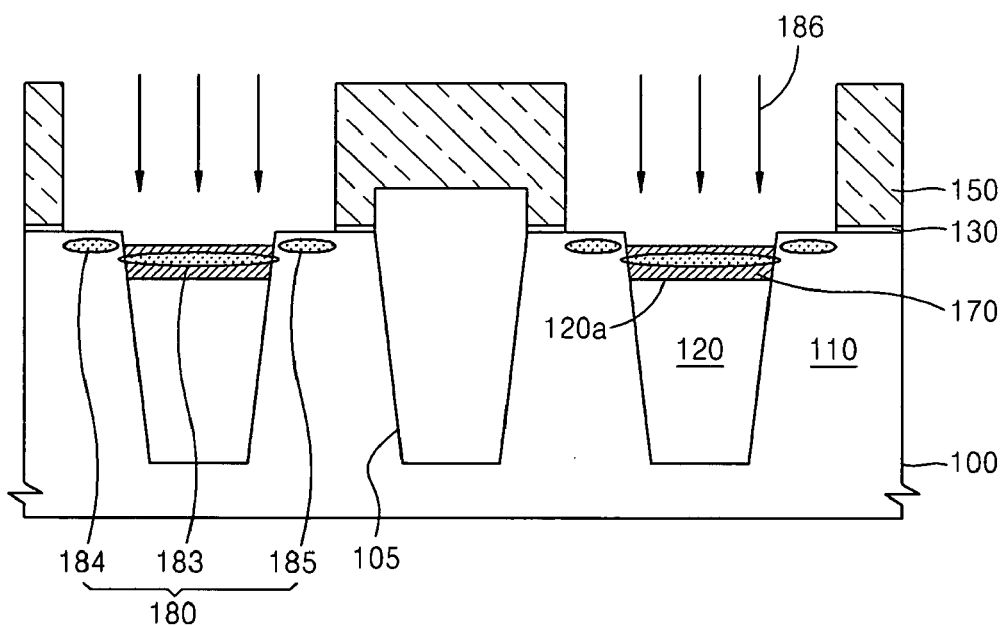

Referring to FIG. 13K, impurities 186 may be doped in the exposed portions of the active regions 110 and in the active bridged patterns 170 using ion implantation. The ion implantation may thus form the ion implantation regions 180.

Figure 13L:
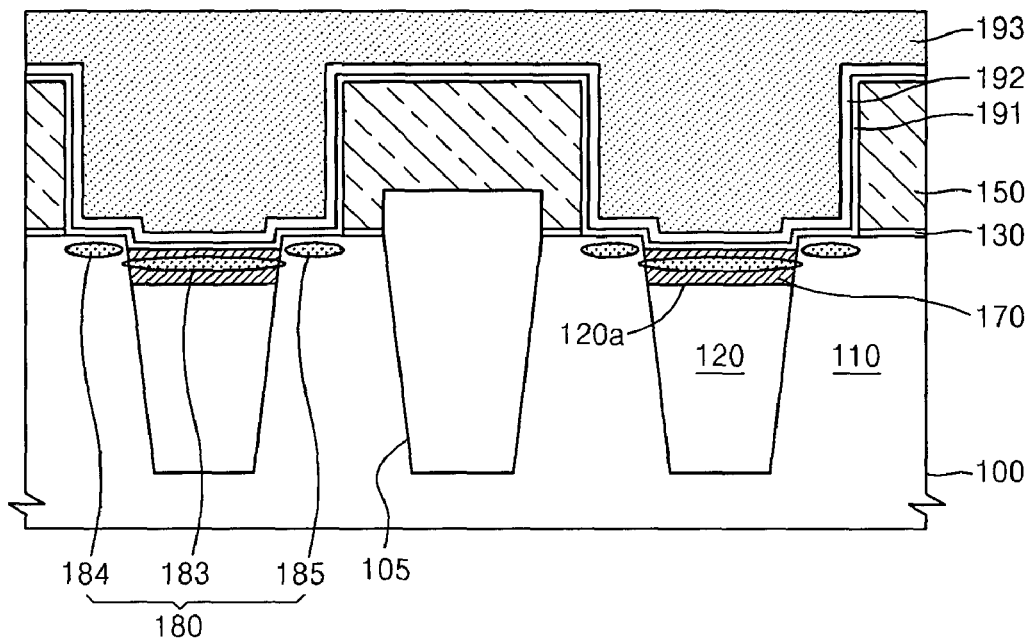

Referring to FIG. 13L, the barrier metal layers 191, 192 may be formed on sidewalls of the openings in the first ILD layer 150, and on the exposed portions of the active regions 110 and active bridged patterns 170 at the bottom of the openings. In an implementation (not shown in FIG. 13L), the spacers 160 may also be formed. A conductive material, e.g., tungsten, polysilicon, etc., may be formed on the substrate 100. The conductive material may fill the openings in the first ILD layer 150. The conductive material may be filled and self-aligned to the opening.

Figure 13M:
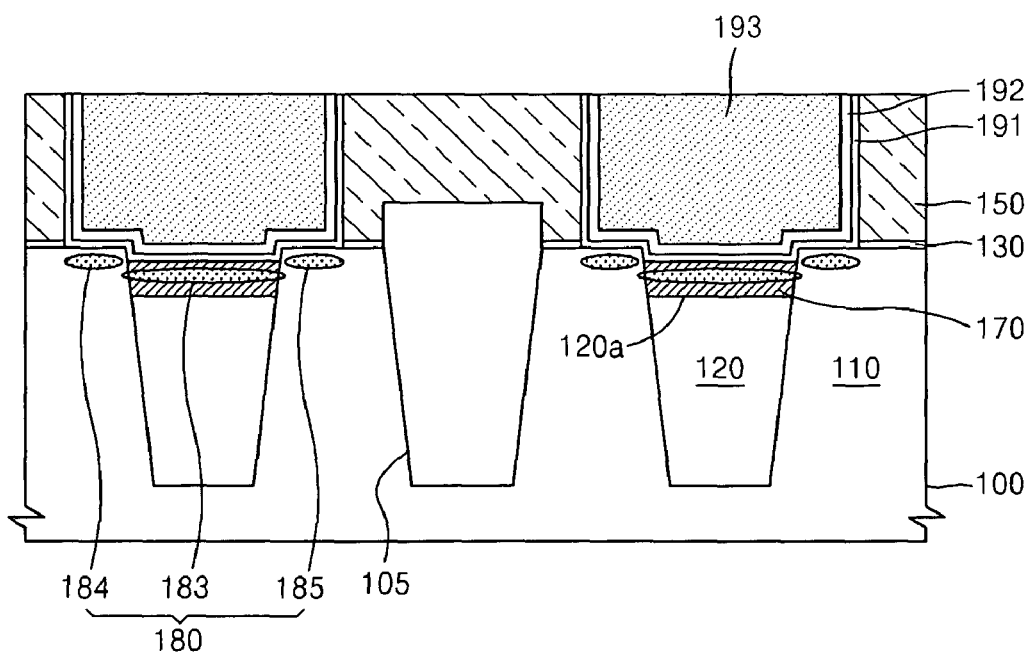

Referring to FIG. 13M, a thinning operation, e.g., CMP, may be used to remove the upper portion of the conductive material so as to form the shared bit line contact plugs 193. The thinning operation may also remove the barrier metal layers 191, 192 from the upper surface of the first ILD layer 150.

Figure 14:
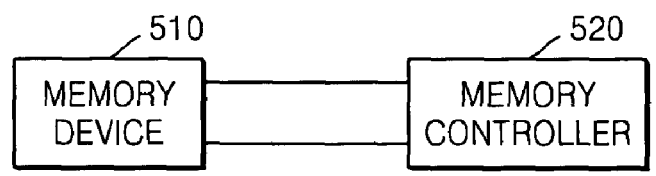
FIG. 14 illustrates a block diagram of one memory system in accordance with example embodiments.

FIG. 14 illustrates a block diagram of a memory system in accordance with example embodiments. Referring to FIG. 14, the memory system may include a memory controller 520 and a memory device 510 electrically connected to the memory controller 520. The memory device 510 may include a flash memory. Here, the flash memory device may be manufactured through any of the above-described processes according to embodiments. Alternatively, the memory device 510 may include other non-volatile semiconductor memory devices or volatile semiconductor devices, e.g., DRAM devices, SRAM devices, etc. The memory controller 520 may provide an input signal into the memory device 510 to control the reading and the erasing operations of the memory device 510. For example, various signals, such as command (CMD), address (ADD), input/output data (DQ) or a high-voltage (VPP) signal, may be applied to the memory controller 520. The memory controller 520 may control the memory device 510 based on the applied various signals. The memory system may be employed in various electronic apparatuses such as a cellular phone, a portable multimedia player, a digital camera, etc.

Figure 15:
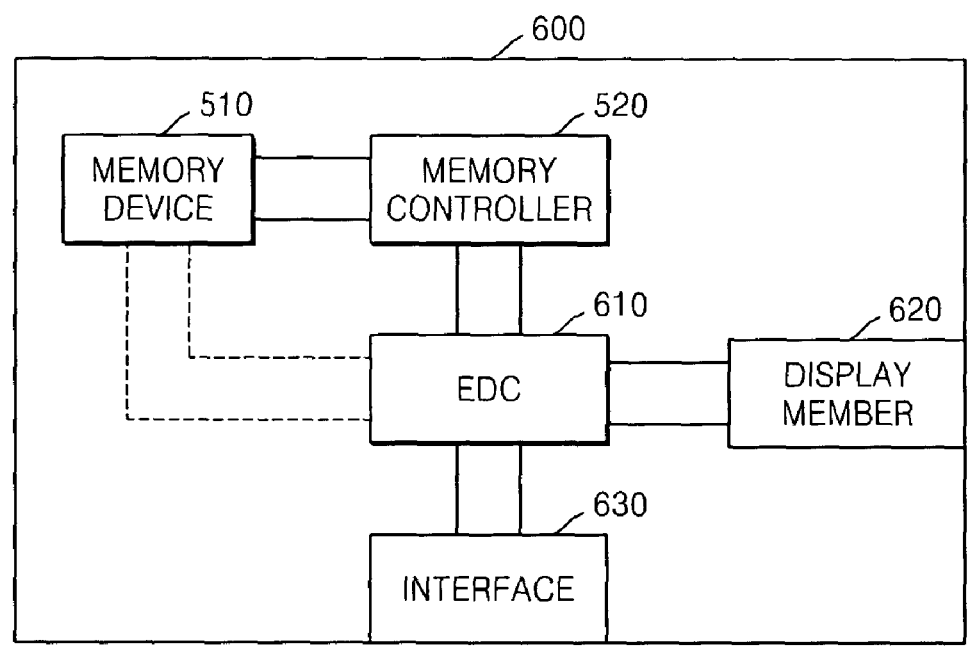
FIG. 15 illustrates a block diagram of another memory system in accordance with example embodiments.

FIG. 15 illustrates a block diagram of another memory system in accordance with example embodiments. Referring to FIG. 15, the memory system may be used in a portable electronic apparatus 600. The portable electronic apparatus 600 may include an MP3 player, a portable video player, a portable multimedia player, a digital camera, etc. The memory system in the portable electronic apparatus 600 may include a memory device 510 and a memory controller 520. Further, the memory system may include an encoder/decoder (EDC) 610, a display member 620, and an interface 630. The memory device 510 may include a flash memory device according to embodiments.

The EDC 610 may input/output data, e.g., audio data or video data, into/from the memory device 510 through the memory controller 520. Alternatively, the data may be directly input from the EDC 610 into the memory device 510 or may be directly output from the memory device 510 into the EDC 610.

The EDC 610 may encode data stored in the memory device 510. For example, the EDS 610 may carry out encoding of MP3 files to store the audio data in the memory device 510. Alternatively, the EDC 610 may encode MPEG files to store video data into the memory device 510. Further, the EDS 610 may include a compound encoder for encoding different file types of various data. For example, the EDC 610 may include an MP3 encoder for the audio data and an MPEG encoder for the video data.

The EDC 610 may decode data stored in the memory device 510. For example, the EDC 610 may perform decoding of the MP3 files based on the audio data stored in the memory device 510. Alternatively, the EDC 610 may execute decoding of MPEG files from the video data stored in the memory device 510. Thus, the EDC 610 may include an MP3 decoder for the audio data and an MPEG decoder for the video data.

In example embodiments, the EDC 610 may include a decoder without an encoder. For example, encoded data may be input into the EDC 610, and then the encoded data may be directly stored into the memory device 510 or may be stored into the memory device 510 through the memory controller 520 when the EDC 610 has the decoder only.

In example embodiments, the EDC 610 may receive data for encoding or encoded data through the interface 630. The interface 630 may meet a predetermined reference such as FireWire (1394) or USB. For example, the interface 630 may include a FireWire interface or a USB interface. Further, the data stored in the memory device 510 may be output through the interface 630.

The display member 620 may display the data output from the memory device 510 or the decoded data from the EDC 610. For example, the display member 620 may include a speaker jack to output the audio data and/or a display screen to display the video data.

Figure 16:
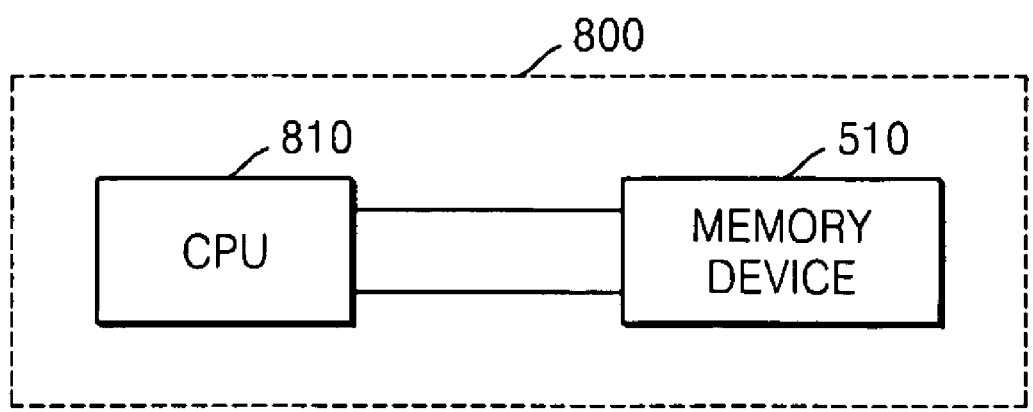
FIG. 16 illustrates a block diagram of still another memory system in accordance with example embodiments.

FIG. 16 illustrates a block diagram of still another memory system in accordance with example embodiments. Referring to FIG. 16, the memory system may include the memory device 510 and a central processing unit (CPU) 810 in a computer system 800. The memory device 510 may be electrically connected to the CPU 810. For example, the computer system 800 may include a personal computer, a personal data assistant, etc. The memory device 510 may be directly connected to the CPU 810 or may be electrically connected to the CPU 810 through a bus.

As described above, devices according to embodiments may provide a high degree of integration while maintaining good contact area between a bit line contact plug and an active region electrically coupled thereto. Moreover, a shared bit line may be used, which avoids deleterious interactions between two closely-spaced bit lines, e.g., RC delay, parasitic capacitance, etc. Further, the methods described above may form the devices with a reduced number of photolithography steps, which may thus simplify fabrication, reduce costs, and increase yields. Forming the devices may include, e.g., a borderless contact method wherein a shared bit line contact plug is in contact with an active region and extends over a field region adjacent to the active region. The fabrication method may also reduce a number of operations required by, e.g., forming a recess in a field region using a single etch operation that also removes an etch mask and/or spacer material above the field region.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
a substrate having first and second active regions, the first and second active regions being disposed on opposite sides of an isolation structure; and
a bit line electrically coupled to a contact plug that is on the isolation structure between the first active region and the second active region, and electrically coupled to an active bridge pattern directly contacting at least one of the first and second active regions,
wherein:
the contact plug is electrically coupled to the first active region and the second active region and directly over at least one of the first active region and the second active region, and
a bottom surface of the active bridge pattern is below a top surface of the first and second active regions.

2. The device as claimed in claim 1, further comprising:
a recess between an upper surface of the first active region and an upper surface of the second active region, the recess being on the isolation structure, such that the upper surface of the isolation structure is lower than the upper surface of the substrate, the recess exposing a sidewall of the first active region and a sidewall of the second active region, wherein:
the active bridge pattern extends across the upper surface of the isolation structure, at least a portion of the active bridge pattern being in the recess and between the isolation structure and the contact plug, and
the active bridge pattern contacts the sidewall of the first active region and the sidewall of the second active region, so as to electrically couple the first active region to the second active region.

3. The device as claimed in claim 2, wherein the active bridge pattern in the recess is a silicon layer.

4. The device as claimed in claim 3, wherein the silicon layer is monocrystalline silicon or polysilicon.

5. The device as claimed in claim 3, wherein at least a portion of the active bridge pattern in the recess includes a dopant.

6. The device as claimed in claim 2, wherein an upper surface of the active bridge pattern extends across an upper surface of the first active region and the second active region.

7. The device as claimed in claim 2, wherein an upper surface of the active bridge pattern is recessed below an upper surface of the first active region and an upper surface of the second active region, such that the upper surface of the silicon layer is bounded by sidewalls of the first and second active regions.

8. The device as claimed in claim 2, further comprising a silicide layer between the active bridge pattern and the contact plug.

9. The device as claimed in claim 2, wherein:
the isolation structure is recessed in the substrate, such that the isolation structure has an upper surface that is lower than an upper surface of the substrate,
a first silicon layer extends across at least a first portion of the upper surface of the isolation structure, the first silicon layer contacting the first active region, a second silicon layer extends across at least a second portion of the upper surface the isolation structure, the second silicon layer contacting the second active region, and the first silicon layer and the second silicon layer are spaced apart from one another.

10. The device as claimed in claim 9, wherein:

an upper surface of the first silicon layer extends across an upper surface of the first active region, and an upper surface of the second silicon layer extends across an upper surface of the second active region.

11. The device as claimed in claim 10, wherein the first silicon layer and the second silicon layer are each monocrystalline silicon.

12. A semiconductor device, comprising:

a substrate having first and second active regions, the first and second active regions being disposed on opposite sides of an isolation structure; and a bit line electrically coupled to a contact plug that is on the isolation structure between the first active region and the second active region, and electrically coupled to an active bridge pattern directly contacting at least one of the first and second active regions, wherein:

the contact plug is electrically coupled to the first active region and the second active region, a bottom surface of the active bridge pattern is below a top surface of the first and second active regions, the isolation structure is recessed in the substrate, such that the isolation structure has an upper surface that is lower than an upper surface of the substrate, and the contact plug extends across the upper surface of the isolation layer and is self-aligned in the recess.

13. The device as claimed in claim 12, further comprising:

a transistor in the first active region;

a spacer on a sidewall of the contact plug, the spacer being over the first active region; and an impurity region in the first active region.

14. A memory system, comprising:

a substrate having a plurality of memory cells; and a bit line on the substrate and electrically coupled to the plurality of memory cells, wherein:

the substrate has first and second active regions, the first and second active regions being disposed on opposite sides of an isolation structure, the bit line is electrically coupled to a contact plug that is on the isolation structure between the first active region and the second active region, and the contact plug is electrically coupled to the first active region and the second active region and directly over at least one of the first active region and the second active region.

* * * * *